(12) United States Patent
Saito et al.

(10) Patent No.: US 7,510,984 B2
(45) Date of Patent: Mar. 31, 2009

(54) METHOD OF FORMING SILICON NITRIDE FILM AND METHOD OF MANUFACTURING SEMICONDUCTOR DEVICE

(75) Inventors: Tsuyoshi Saito, Kanagawa-ken (JP); Hiromi Itoh, Kanagawa (JP); Makiko Kitazoe, Kanagawa (JP)

(73) Assignee: Ulvac, Inc., Chigasaki-shi (JP)

( * ) Notice: Subject to any disclaimer, the term of this patent is extended or adjusted under 35 U.S.C. 154(b) by 164 days.

(21) Appl. No.: 11/057,246

(22) Filed: Feb. 15, 2005

(65) Prior Publication Data
US 2005/0196977 A1    Sep. 8, 2005

(30) Foreign Application Priority Data
Mar. 2, 2004    (JP) .............................. 2004-058214

(51) Int. Cl.
*H01L 21/4763*    (2006.01)
(52) U.S. Cl. ..................... 438/791; 438/793; 438/788
(58) Field of Classification Search ................ 438/791, 438/793, 788
See application file for complete search history.

(56) References Cited

U.S. PATENT DOCUMENTS

| | | | | |
|---|---|---|---|---|
| 5,234,869 A * | 8/1993 | Mikata et al. | ............... | 438/793 |
| 5,874,368 A | 2/1999 | Laxman et al. | | |
| 5,968,611 A | 10/1999 | Kaloyeros et al. | | |
| 6,069,094 A * | 5/2000 | Matsumura et al. | .......... | 438/788 |
| 6,349,669 B1 * | 2/2002 | Matsumura et al. | ... | 118/723 HC |
| 6,653,212 B1 * | 11/2003 | Yamanaka et al. | .......... | 438/485 |
| 6,723,664 B2 * | 4/2004 | Matsumura et al. | .......... | 438/788 |
| 7,098,150 B2 * | 8/2006 | Misra et al. | .................. | 438/778 |
| 2005/0158983 A1 * | 7/2005 | Hoshi et al. | .................. | 438/623 |
| 2005/0196970 A1 * | 9/2005 | Misra et al. | .................. | 438/778 |

(Continued)

FOREIGN PATENT DOCUMENTS

JP    56-25018    6/1981

(Continued)

*Primary Examiner*—Laura M Menz
(74) *Attorney, Agent, or Firm*—Oblon, Spivak, McClelland, Maier & Neustadt, P.C.

(57) ABSTRACT

A method of forming a silicon nitride film comprises: forming a silicon nitride film by applying first gas containing silicon and nitrogen and second gas containing nitrogen and hydrogen to catalyst heated in a reduced pressure atmosphere. A method of manufacturing a semiconductor device comprising the steps of: forming a silicon nitride film by the method as claimed in claim 1 on a substrate having the semiconductor layer, a gate insulation film selectively provided on a principal surface of the semiconductor layer, and a gate electrode provided on the gate insulation film; and removing the silicon nitride film on the semiconductor layer and the gate electrode and leaving a sidewall comprising the silicon nitride film on a side surface of the gate insulation film and the gate electrode by etching the silicon nitride film in a direction generally normal to the principal surface of the semiconductor layer. A method of manufacturing a semiconductor device comprising the steps of: forming a silicon nitride film by the method as claimed in claim 1 on a substrate including a semiconductor layer; forming an interlayer insulation layer on the silicon nitride film; forming a layer having an opening on the interlayer insulation layer; and etching the interlayer insulation layer via the opening in a condition where an etching rate for the silicon nitride film is greater than an etching rate for the interlayer insulation layer.

8 Claims, 18 Drawing Sheets

U.S. PATENT DOCUMENTS

| | | | |
|---|---|---|---|
| 2005/0196977 A1* | 9/2005 | Saito et al. | 438/791 |
| 2005/0235828 A1* | 10/2005 | Ishihara | 95/131 |
| 2006/0032443 A1* | 2/2006 | Hasebe et al. | 118/715 |
| 2006/0084281 A1* | 4/2006 | Misra et al. | 438/778 |
| 2006/0205231 A1* | 9/2006 | Chou et al. | 438/770 |
| 2006/0207504 A1* | 9/2006 | Hasebe et al. | 118/715 |
| 2007/0135552 A1* | 6/2007 | Wrosch et al. | 524/443 |
| 2007/0167028 A1* | 7/2007 | Chou et al. | 438/758 |
| 2007/0190807 A1* | 8/2007 | Misra et al. | 438/785 |
| 2008/0063791 A1* | 3/2008 | Hasebe et al. | 427/96.8 |

FOREIGN PATENT DOCUMENTS

| | | |
|---|---|---|
| JP | 61-234534 | 10/1986 |
| JP | 06-338497 | 12/1994 |
| JP | 06338497 A * | 12/1994 |
| JP | 10-083988 | 3/1998 |
| JP | 11-172439 | 6/1999 |
| JP | 2001-524601 | 12/2001 |
| JP | 2003-166060 | 6/2003 |
| JP | 2003-309119 | 10/2003 |
| WO | WO 99/27154 | 6/1999 |

* cited by examiner

METHOD OF FORMING SILICON NITRIDE FILM AND METHOD OF MANUFACTURING SEMICONDUCTOR DEVICE

CROSS-REFERNCE TO ERLATED APPLICATIONS

This Application is based upon and claims the benefit of priority from the prior Japanese Patent Application No. 2004-058214, filed on Mar. 2, 2004; the entire contents of which are incorporated herein by reference.

BACKGROUND OF THE INVENTION

The invention relates to a method of forming a silicon nitride film and a method of manufacturing a semiconductor device, and more particularly, to a method of forming a silicon nitride film having good step coverage by the catalytic CVD method and a method of manufacturing a semiconductor device.

Silicon nitride film plays an important role in various applications such as passivation film, etching stopper, and hard mask in semiconductor devices. Furthermore, it is used as gate sidewall for forming LDD (lightly doped drain) structure of MOSFET (metal-oxide-semiconductor field effect transistor).

Conventionally, silicon nitride film used for these applications is formed by the plasma CVD (chemical vapor deposition) method or photo-CVD method (see, e.g., Japanese Laid-Open Patent Applications 2002-75992 and S61-234534 (1986)).

However, use of the plasma CVD method involves some problems such as plasma charge-up of the wafer, leaving room for improvement in recent ultrafine semiconductor devices as typified by the 65-nm node generation. On the other hand, use of the photo-CVD method does not involve damage by charged particles. However, it has a low deposition rate because of low decomposition rate of raw material gas, and hence there is a problem that it is not suitable to mass production.

In this respect, the catalytic CVD method is recently developed. In the catalytic CVD method, raw material gas is contacted in a reduced pressure atmosphere with a metal filament heated, for example, above 1600° C., and thus subjected to decomposition and/or activation by catalysis to deposit a thin film on a substrate. The catalytic CVD method avoids damage caused by using plasma, and does not require radio-frequency power supply. It can thus significantly simplify the configuration of the apparatus.

Furthermore, in the conventional plasma CVD method, the usage efficiency of raw material gas is only a few percent. On the contrary, in the catalytic CVD method, a usage efficiency of nearly 80 percent can be achieved. In addition, it has a high deposition rate, and can deposit a thin film of high quality that is low in hydrogen content.

However, the inventor has found upon investigation that coverage for steps and grooves have room for improvement in a silicon nitride film formed by the catalytic CVD method. More specifically, when a silicon nitride film is deposited by the catalytic CVD method using silane ($SiH_4$) and ammonia ($NH_3$) as raw material, the deposition rate is low on the side surface of steps on the substrate and inside the grooves. If the pressure during deposition is decreased and the feed rate for ammonia relative to silane is decreased, the coverage is improved, but a silicon-rich thin film is formed because of insufficient nitridation of silicon.

SUMMARY OF THE INVENTION

According to an aspect of the invention, there is provided a method of forming a silicon nitride film comprising: forming a silicon nitride film by applying first gas containing silicon and nitrogen and second gas containing nitrogen and hydrogen to catalyst heated in a reduced pressure atmosphere.

According to other aspect of the invention, there is provided a method of manufacturing a semiconductor device comprising the steps of: forming a silicon nitride film by the method as claimed in claim 1 on a substrate having the semiconductor layer, a gate insulation film selectively provided on a principal surface of the semiconductor layer, and a gate electrode provided on the gate insulation film; and removing the silicon nitride film on the semiconductor layer and the gate electrode and leaving a sidewall comprising the silicon nitride film on a side surface of the gate insulation film and the gate electrode by etching the silicon nitride film in a direction generally normal to the principal surface of the semiconductor layer.

According to other aspect of the invention, there is provided a method of manufacturing a semiconductor device comprising the steps of: forming a silicon nitride film by the method as claimed in claim 1 on a substrate including a semiconductor layer; forming an interlayer insulation layer on the silicon nitride film; forming a layer having an opening on the interlayer insulation layer; and etching the interlayer insulation layer via the opening in a condition where an etching rate for the silicon nitride film is greater than an etching rate for the interlayer insulation layer.

According to the invention, damage onto the gate oxide layer caused by a charge-up is eliminated because the raw material gas species are decomposed without using plasma. Further, the invention is appropriate to the manufacturing of semiconductor devices with 65-nanometer technology or more recent one because the thin films can be formed at a low temperature as low as 400 degrees centigrade, for example. Furthermore, according to the invention, silicon nitride films having a good step coverage, lower content of hydrogen, ideal balance of composition ration of silicon and nitrogen can be obtained.

As a result, according to the invention, it becomes possible to manufacture semiconductor devices of a high performance with a high degree of integration, and thus, the industrial merit is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
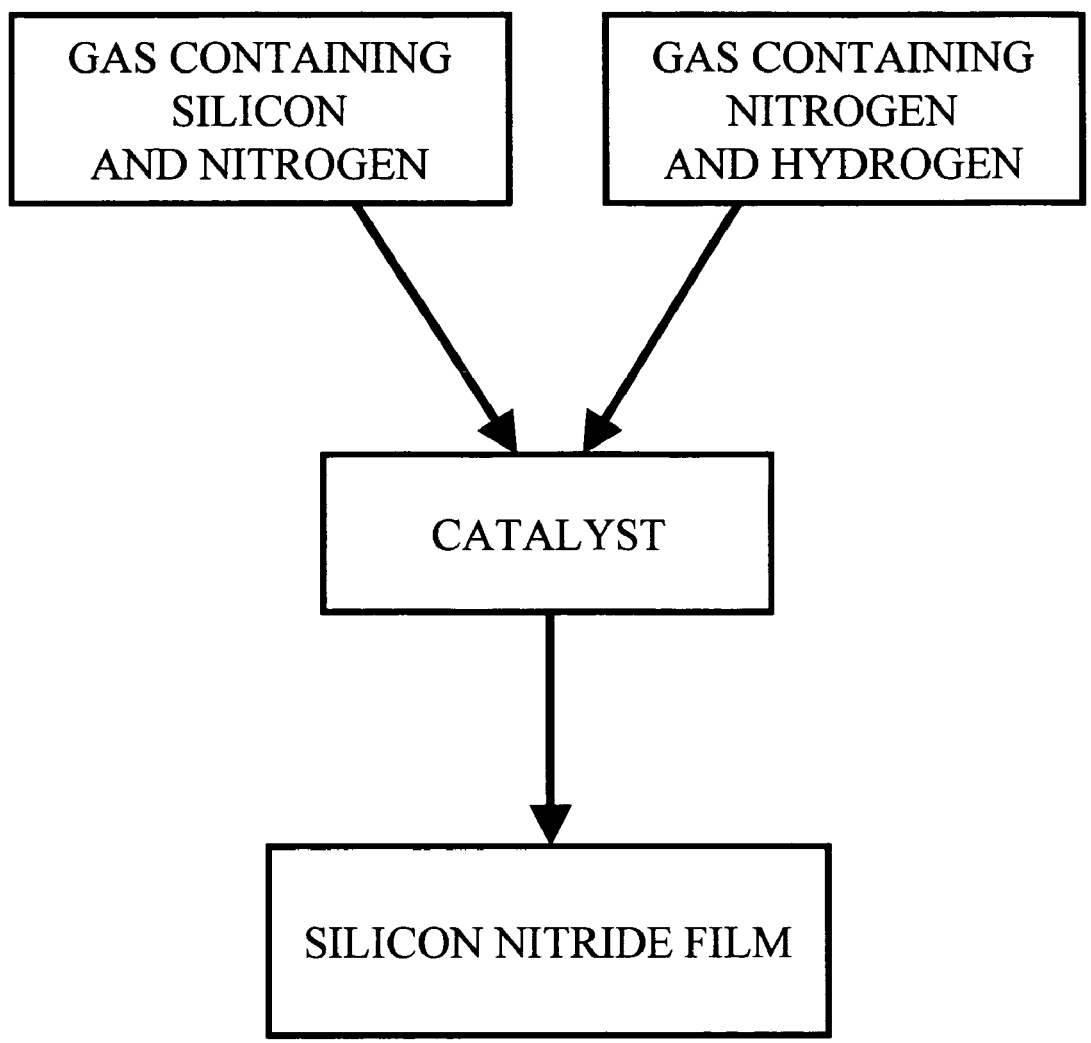
FIGS. 1 and 2 are schematic diagrams showing methods of forming a silicon nitride film according to an embodiment of the invention.

The catalytic CVD method employed in the invention has the following essential advantages compared to the photo-CVD disclosed, for example, in Japanese Laid-Open Patent Application S61-234534 (1986):

First, by using the catalytic CVD method, thin films having higher density and higher purity can be obtained than by using the photo-CVD method at a same deposition temperature. For example, in the case where hydride row materials such as silane-group or amine-group are used, the amount of hydrogen incorporated in the thin film can be greatly reduced by using the catalytic CVD method.

In the case of the photo-CVD including a laser-assisted CVD, the optimum pressure for film deposition is in a range of 100 pascals through a few hundreds pascals, which is similar to the conventional low pressure CVD and plasma CVD. This optimum range is determined by the fact that practical and/or productive deposition rate is not obtained if the pressure is set lower than the range because the optical thickness of the raw material gas which should absorb the excitation light becomes thinner, and thus, the quantum efficiency (the efficiency of generation of free radicals which becomes the deposition precursor) goes down. This is why the gas phase should not be too dilute in photo-CVD method.

However, if the deposition pressure is set high, the deposition species such as deposition precursor generated by the light irradiation collide with other gas species before they reach the substrate and kinetic energy of the deposition species becomes lower. Therefore, the density or compactness of the film becomes lower because the incident kinetic energy of the deposition species onto the growth front of the film becomes lower.

Further, if the deposition pressure is set high, there is a problem that the purity of the film may become lower because the background gas molecules collide against the growth front with a high frequency.

In contrast, in the case of catalytic CVD, the practical deposition is possible even at a pressure lower than a tenth of the deposition pressure of the photo-CVD. That is, by using the catalytic CVD, a practical deposition rate can be obtained at a pressure as low as 10 pascals, which is much lower than optimum pressures of the photo-CVD, plasma CVD and LPCVD. This is because the raw material gas species are decomposed and excited with an extremely high efficiency by a catalyst which is heated at a high temperature and thus the deposition species are generated at a high rate.

In the case of catalytic CVD, the kinetic energy of the deposition species such as deposition precursors may not be lowered because the collision rate with the other gas species is lower by performing the deposition at a lower pressure. That is, the deposition species reach the growth front of the film while keeping a high kinetic energy. As a result, a thin film having a high density (compactness) can be formed. At the same time, undesirable incorporation of impurities such as hydrogen can be suppressed because the growth pressure is set low and thus the rate of collision of the background gas species against the growth front is low. As a result, a thin film having a high purity can be obtained.

In fact, silicon nitride films grown at 10 pascals by the catalytic CVD are much more dense and have much lower amount of the incorporated hydrogen compared to those grown by photo-CVD and plasma CVD at a same growth temperature (about 300 degrees centigrade), and have almost same or even better film quality than those grown by LPCVD at a growth temperature of 800 degrees centigrade.

In the case of catalytic CVD, when the raw material gas species adsorb on the catalyst and decomposed and excited to form the precursor, a part of the high thermal vibration energy which is transmitted from the surface of the catalyst heated at extremely high temperature as high as about 1700 degrees centigrade is transformed into a translational energy of the precursors. And because the deposition pressure is set low, the activity of these precursors is not degraded when they are transferred to the surface of the substrate and thus the precursor impinge on the substrate while keeping their energy. This is why the self-forming process to form thin films having a high density can be realized without depending on an assist of a temperature of the substrate.

The above-described explanation can be summarized as follows:

(1) In the case of catalytic CVD, the deposition precursors can be generated with an extremely high efficiency by the action of the catalyst heated at a high temperature upon the raw material gas species. Therefore, the deposition pressure can be greatly lowered than the conventional deposition methods.

(2) The translational energy of the precursors is high when they dissociate from the catalyst because the catalyst is heated at a extremely high temperature to generate the precursors. And the activity of the precursors is not degraded when they are transferred to the substrate because the deposition pressure is kept low.

(3) As a result, thin films having a high density can be obtained because the kinetic energy of the precursors which impinge onto the surface of the substrate is high. Furthermore, the purity of the films becomes high because the incorporation of the background gas species is suppressed by keeping the deposition pressure low.

Embodiments of the invention will now be described in detail with reference to the drawings.

Figure 2:
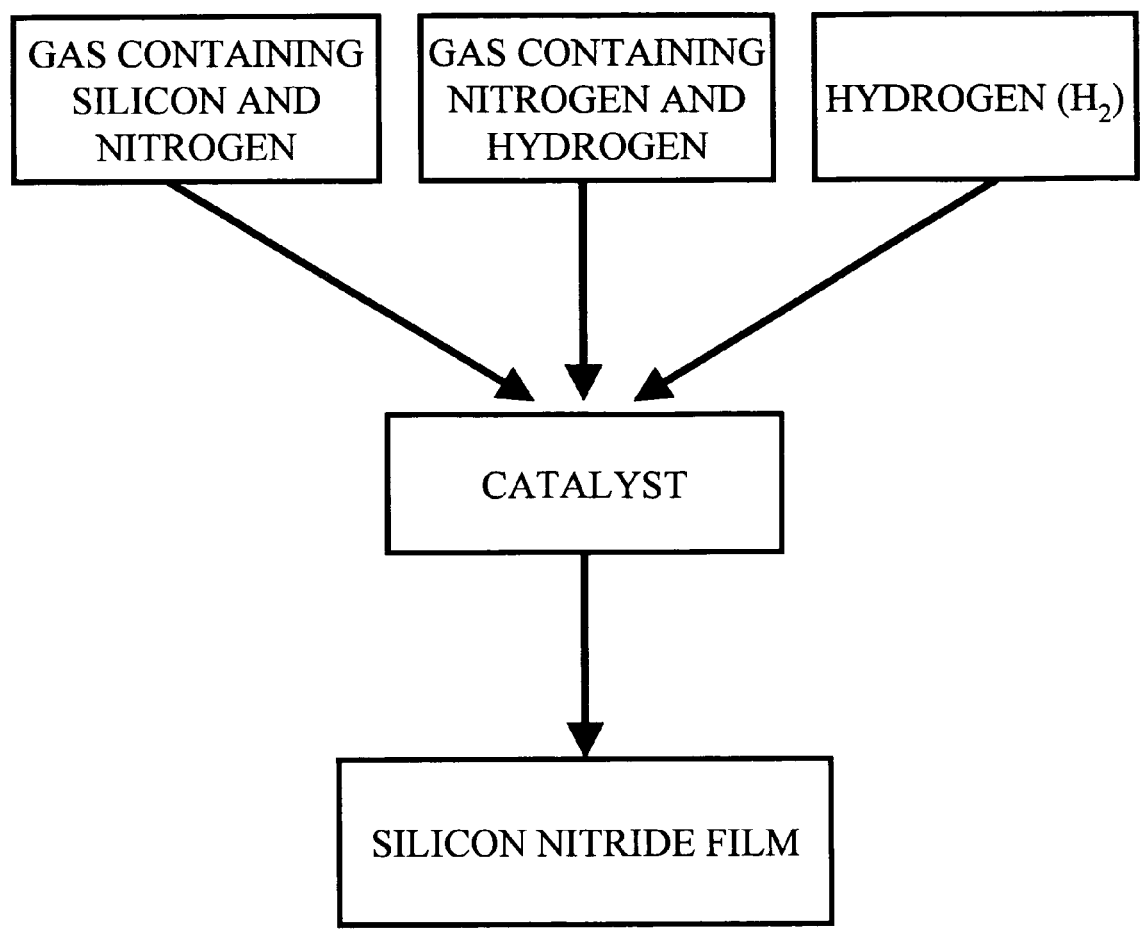

FIGS. 1 and 2 are a schematic diagram showing a method of forming a silicon nitride film according to an embodiment of the invention, respectively. More specifically, in the invention, as shown in FIG. 1, first material gas containing silicon (Si) and nitrogen (N), and second material gas containing nitrogen (N) and hydrogen (H) are used. In addition, as shown in FIG. 2, hydrogen ($H_2$) can be further added.

The first material gas may include, for example, trisilylamine ((SiH$_3$)$_3$N) (TSA), disilylamine ((SiH$_3$)$_2$NH), and (C$_x$H$_y$)$_z$SiX (where X is an amino group). The second material gas may include, for example, ammonia (NH$_3$) and methylamine (CH$_3$NH$_2$).

These gases are fed to catalyst that is placed in a reduced pressure atmosphere and heated. Decomposition or other reaction of the material gases by catalysis then occurs on the surface of the catalyst to form a silicon nitride film on the substrate.

Figure 3:
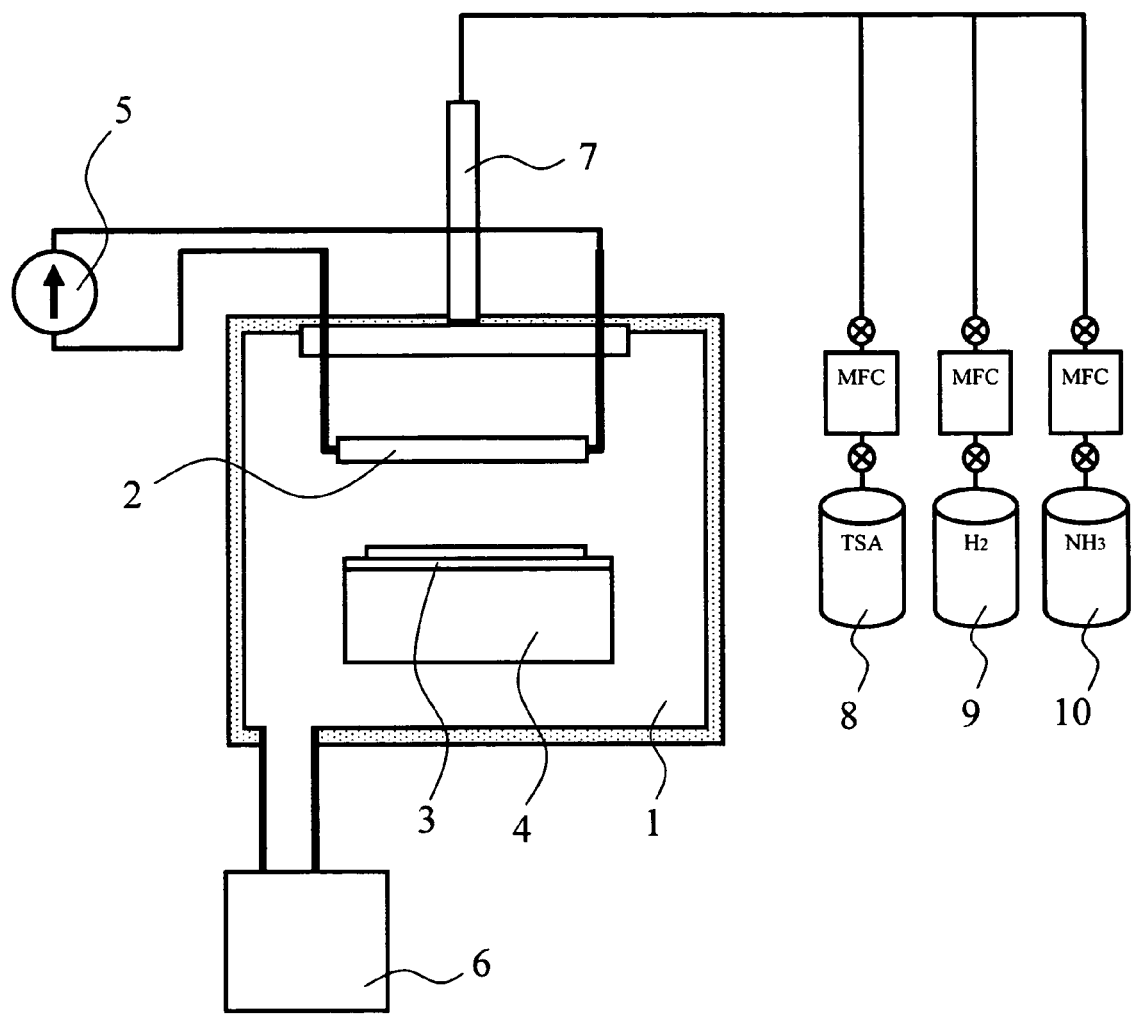
FIG. 3 is a schematic diagram illustrating the configuration of a catalytic CVD apparatus used in the present embodiment.

FIG. 3 is a schematic diagram illustrating the configuration of a catalytic CVD apparatus used in the present embodiment.

More specifically, the catalytic CVD apparatus comprises a reaction chamber 1, a vacuum evacuation system 6 for evacuating the inside of the reaction chamber 1, and gas feeding systems 8 to 10. The gas feeding system 8 feeds the first material gas containing silicon (Si) and nitrogen (N). The gas feeding system 9 feeds the second material gas containing nitrogen and hydrogen.

These material gases are introduced into the reaction chamber 1 via a shower head 7. At this time, the inside of the reaction chamber 1 is evacuated by the vacuum evacuation system 6 such as a turbo molecular pump, which enables a predetermined reduced pressure atmosphere to be maintained. Material gas emitted from the shower head 7 is decomposed and/or activated by catalysis on the surface of catalyst 2. At this time, the catalyst 2 is electrically heated to a temperature of about 1600° C. by, for example, an electric current source 5. The catalyst 2 may be made of, for example, tungsten (W), platinum (Pt), palladium (Pd), molybdenum (Mo), tantalum (Ta), titanium (Ti), vanadium (V), rhenium (Re), iridium (Ir), silicon (Si), and alumina (AlO$_x$).

Particles decomposed and/or activated by the catalyst 2 fall on the substrate 3 to deposit a silicon nitride film.

A specific example carried out by the inventor will now be described.

More specifically, 15 sccm of trisilylamine (TSA) for the first material gas containing silicon and nitrogen, 30 sccm of ammonia (NH$_3$) for the second material gas containing nitrogen and hydrogen, and 50 sccm of hydrogen (H$_2$) are introduced into the reaction chamber 1. Trisilylamine is introduced from the material gas feeding system 8 into the reaction chamber 1 under the control of flow rate by a mass flow controller. Similarly, hydrogen and ammonia are introduced from the material gas feeding systems 9 and 10, respectively.

The pressure inside the reaction chamber 1 is reduced by the vacuum evacuation system 6 and maintained at 4 to 15 Pa. The substrate 3 is held on a substrate stage 4 with electrostatic chuck mounted at a position 75 mm away from catalyst, which is a tungsten wire 2, and the temperature of the substrate 3 is controlled to be 350° C. The catalyst 2 is electrically heated by a power supply 5 and controlled at about 1700° C. The condition for the present example is summarized below.

The film formation rate of the silicon nitride film obtained in this condition was a practical value of about 20 nm per minute. The refractive index of the silicon nitride film was determined to be 1.98, which indicated that stoichiometric silicon nitride was obtained. The formation condition and the obtained result for the present specific example are summarized as follows:

| | |
|---|---|
| trisilylamine | 15 sccm |
| ammonia | 30 sccm |
| hydrogen | 50 sccm |
| catalyst-substrate distance | 75 mm |
| catalyst temperature | 1700° C. |
| substrate temperature | 350° C. |
| film formation rate | 20 nm/min |
| refractive index | 1.98 |

It can be confirmed from the above result that a silicon nitride film of good film quality can be formed at a practical film formation rate according to the invention. In addition, according to the present example, excellent step coverage is obtained.

Figure 4A:
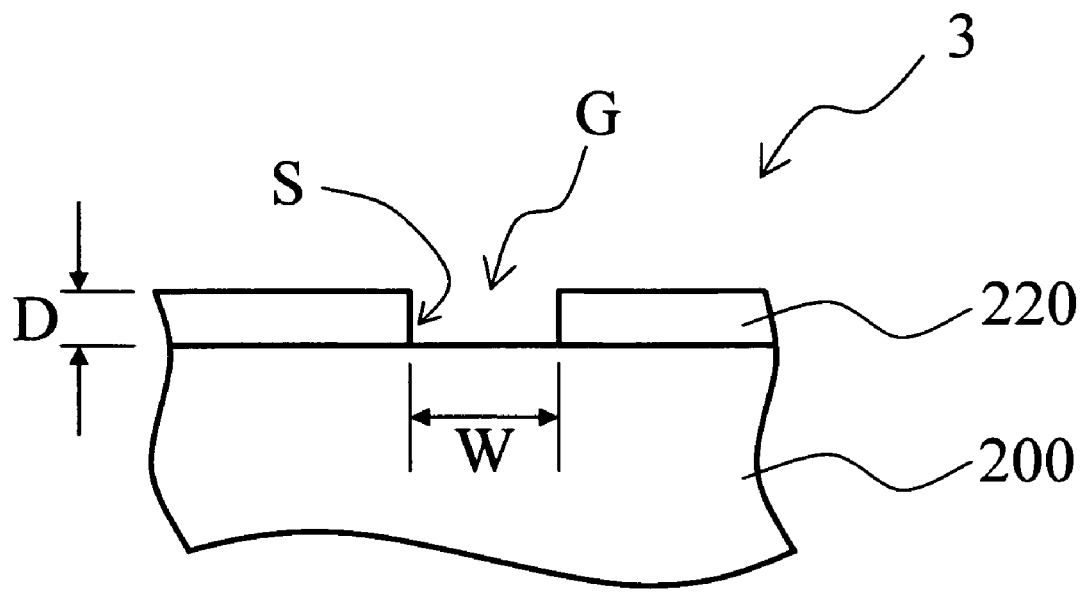
FIG. 4A is a cross-sectional view showing a state before a silicon nitride film 240 is deposited.
Figure 4B:
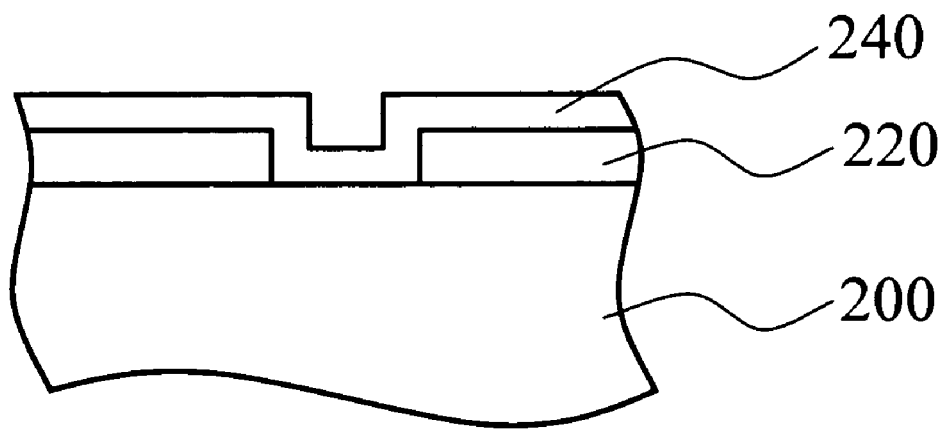
FIG. 4B is a cross-sectional view showing a state after a silicon nitride film 240 is deposited.
Figure 5A:
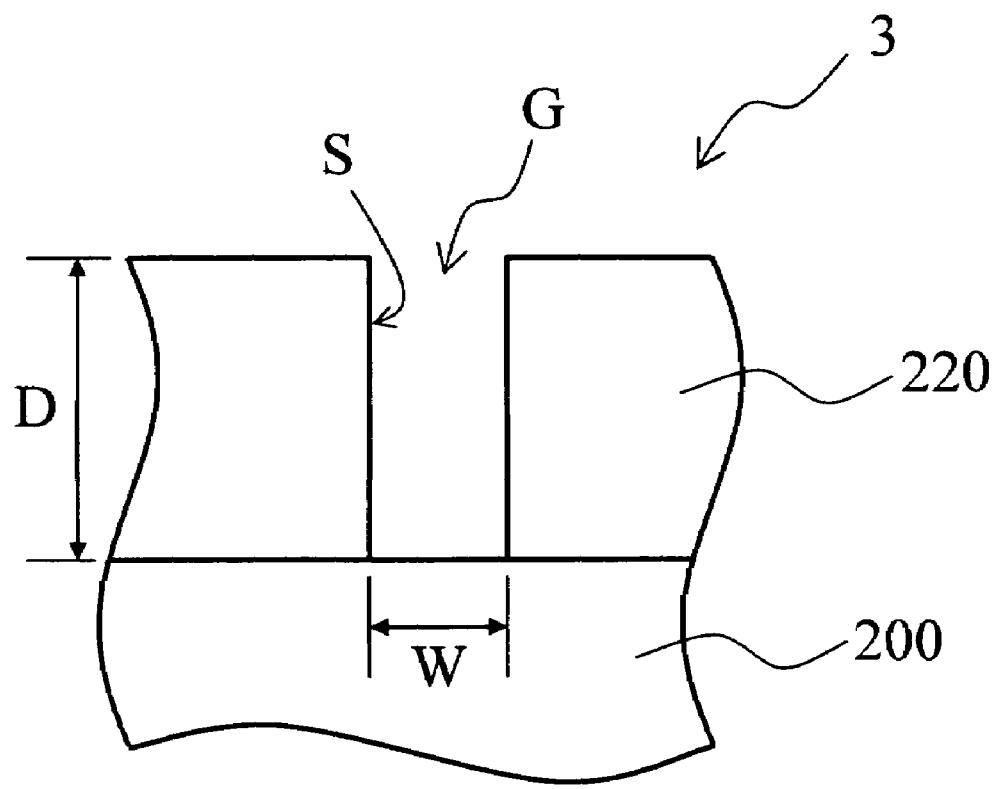
FIGS. 5A and 5B are schematic cross-sectional views showing the step coverage for a large ratio of D/W.
Figure 5B:
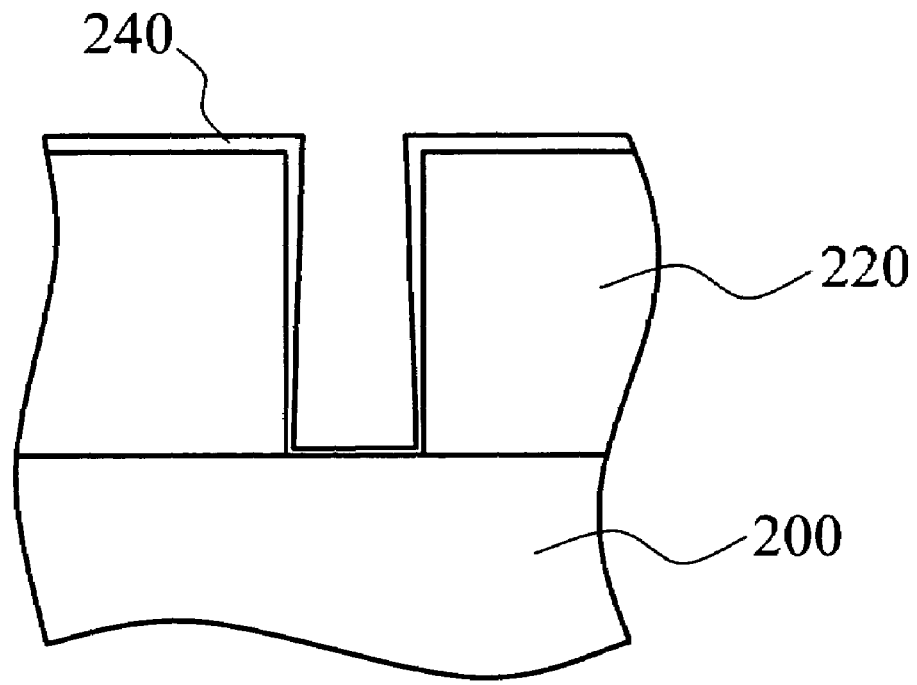
Figure 6:
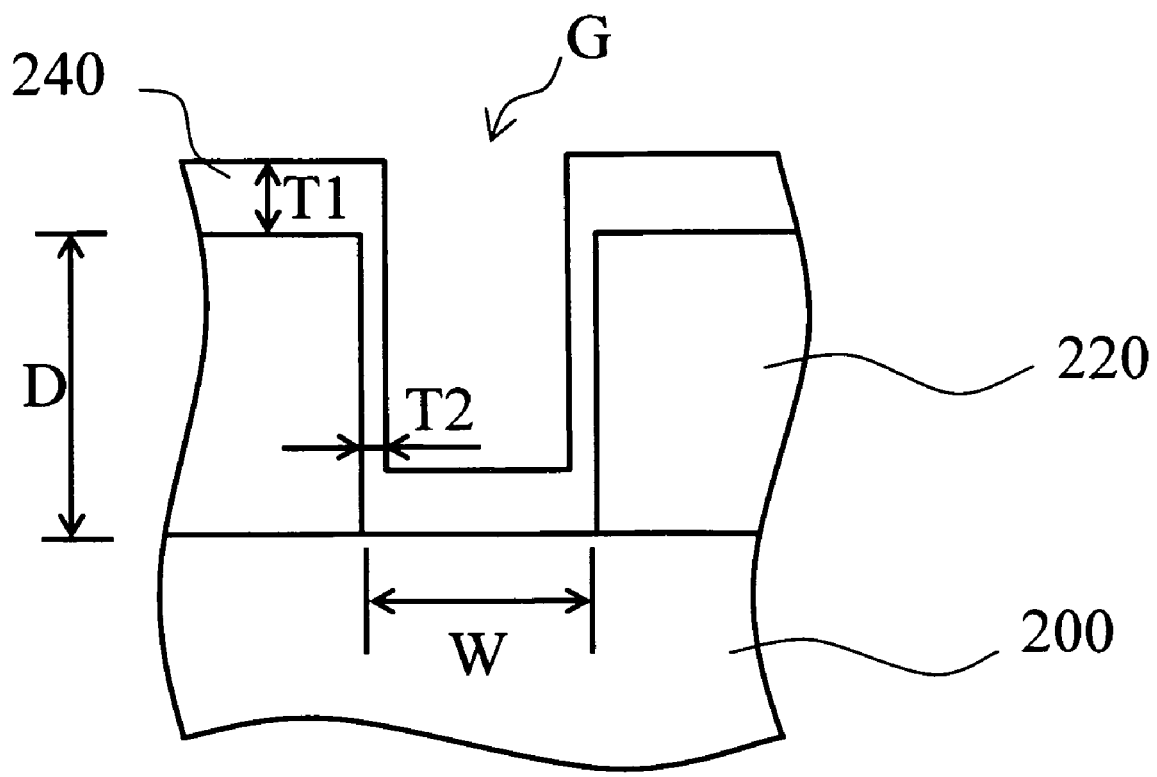
FIG. 6 is a schematic cross-sectional view for illustrating the definition of step coverage.

FIGS. 4 to 6 are a schematic cross-sectional view for illustrating step coverage.

FIG. 4A is a cross-sectional view showing a state before a silicon nitride film 240 is deposited, and FIG. 4B is a cross-sectional view showing a state after it is deposited. Here, the substrate 3 is a structure comprising a first layer 210 such as a semiconductor wafer on which a second layer 220 is patterned. More specifically, the second layer 220 is patterned to form a groove G. When this structure is used as the substrate 3 and a silicon nitride film 240 is deposited thereon, the silicon nitride film 240 is formed with substantially identical thickness also on the bottom and sidewall S of the groove G as well as on the second layer 220, as shown in FIG. 4B. That is, good step coverage is obtained.

According to the inventor's trial production and investigation, in the catalytic CVD method using silane (SiH$_4$) and ammonia, for example, such a good step coverage is obtained when the ratio D/W of depth D to width W of the groove G is up to about 0.5. In other words, when the depth D is small as compared to the width W of the groove, a relatively good step coverage is obtained. However, the step coverage decreases as the ratio D/W increases.

FIG. 5 is a schematic cross-sectional view showing the step coverage for a large ratio of D/W. More specifically, as the ratio D/W increases and thus the depth D is larger as compared to the width W of the groove G, the silicon nitride film 240 deposited on the sidewall S and bottom of the groove G has smaller thickness.

FIG. 6 is a schematic cross-sectional view for illustrating the definition of step coverage. More specifically, the definition uses thickness T1 of the silicon nitride film 240 formed on the upper surface of the groove G and thickness T2 of the silicon nitride film 240 deposited on the sidewall near the bottom of the groove G. Coverage is defined as a ratio T2/T1 of these thicknesses T1 and T2.

For example, when a silicon nitride film 240 is formed on a substrate having a deep groove G with ratio D/W exceeding two by catalytic CVD method using silane (SiH$_4$) and ammonia, the film may be formed on the sidewall S or bottom of the groove G with a thickness of only about 30 percent as compared to that on the upper surface of the second layer 220.

Figure 7A:
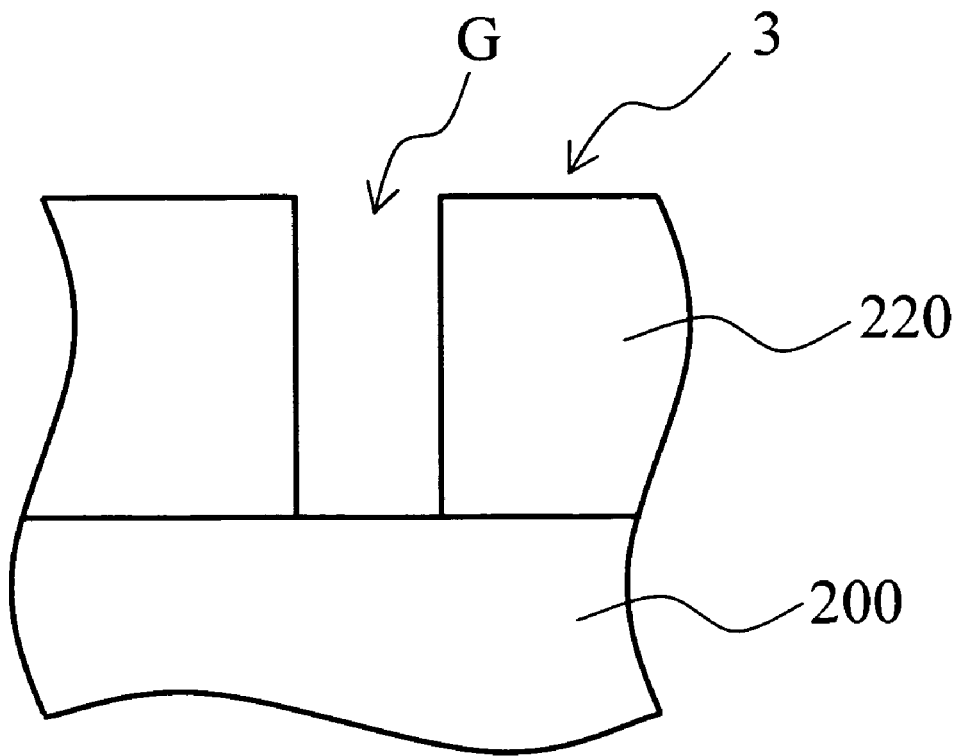
FIGS. 7A and 7B are schematic cross-sectional views showing that the silicon nitride film 240 is formed with sufficient thickness also on the sidewall S and the bottom surface of groove G according to the invention.
Figure 7B:
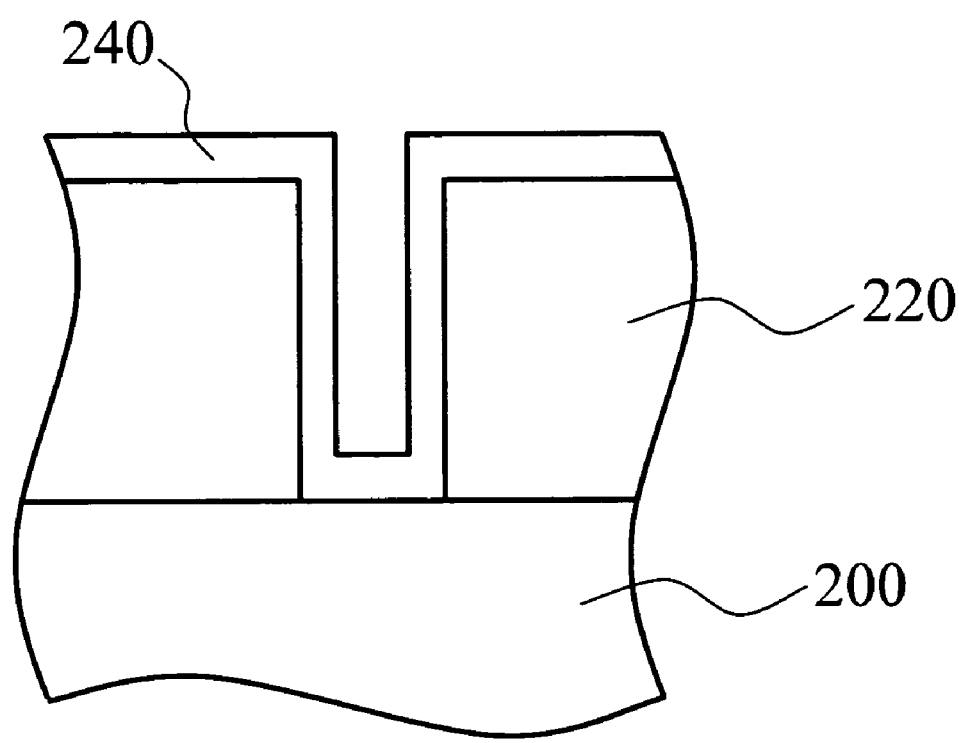

In this respect, according to the invention, a silicon nitride film 240 can be formed also on the sidewall S and bottom of the groove G with sufficient thickness, as shown in FIG. 7. More specifically, by the method of the example according to the invention described above, the film was successfully formed on the sidewall S and bottom of the groove G with a thickness of 90 percent or more as compared to that on the upper surface of the second layer 220. In other words, according to the invention, good step coverage is obtained even for a large ratio D/W of groove G.

One reason for such good step coverage obtained by the invention is the introduction of hydrogen (H$_2$) as one of the material gases. More specifically, in the catalytic CVD method, material gas such as trisilylamine and ammonia is decomposed by heated catalyst 2 at an extremely high efficiency. As a result, a large amount of active hydrogen atoms on the order of $10^{12}$ atoms/cm$^3$ are produced and adsorbed on the surface of the substrate 3. However, the reaction of abstracting adsorbed hydrogen proceeds at the same time. Hence, characteristically, the thin film thus formed has low residual hydrogen content.

In other words, the catalytic CVD method has high decomposition efficiency for material gas. When hydrogenation gas such as SiH$_4$ is used for the material gas, a large amount of atomic hydrogen can be produced. Decomposition of hydrogen into the atomic state promotes ejection of extra hydrogen from the formed film, which enables a very compact silicon nitride film to be formed.

In addition, since adsorption and desorption of hydrogen frequently occur on the surface of the silicon nitride film 240 under formation, there are sufficiently many active sites on the surface of the thin film under formation from a microscopic point of view.

Figure 8A:
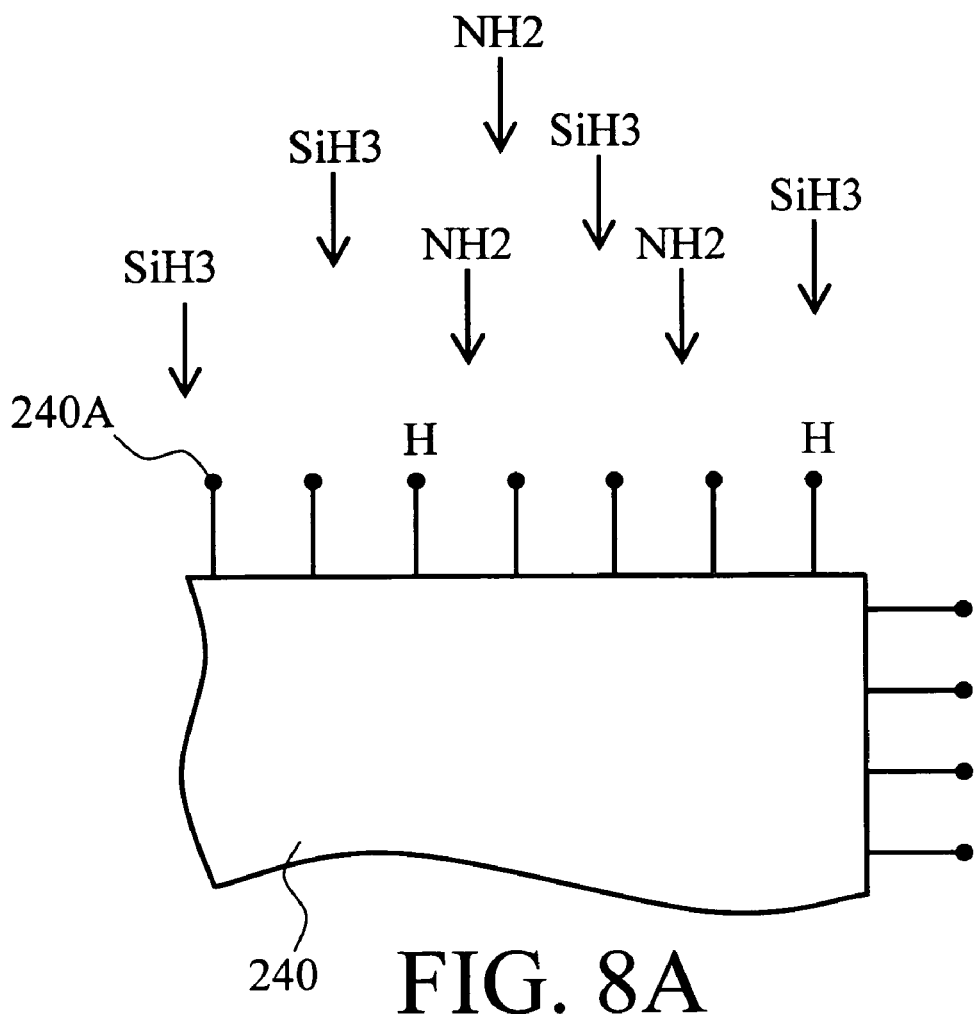
FIGS. 8A and 8B are conceptual diagrams showing a surface condition of silicon nitride film under formation.
Figure 8B:
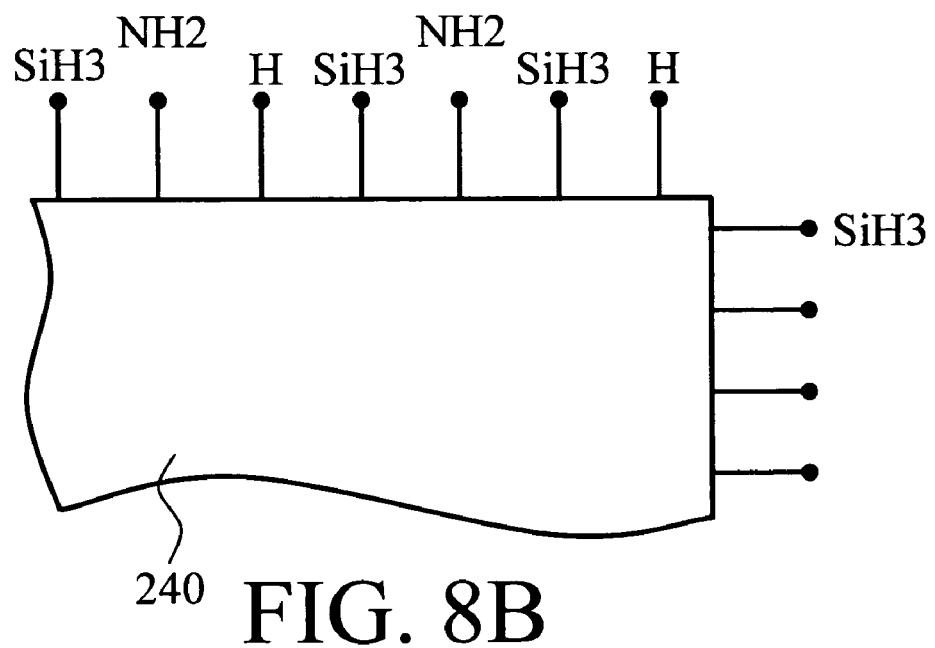

FIG. 8 is a conceptual diagram showing a surface condition of silicon nitride film under formation. More specifically, FIGS. 8A and 8B are a partial enlarged cross-sectional view showing an edge of an opening of the groove G.

As shown in FIG. 8A, the surface of silicon nitride film 240 under formation has active sites 240A where incoming deposition species are adsorbed. SiH$_3$ (silyl), Si—N—H$_x$ (molecule in which silicon, nitrogen and hydrogen are bonded), and NH$_2$, which are main deposition species produced by decomposition of trisilylamine served as material gas, fall on the upper surface and the groove G of the silicon nitride film 240 under formation. However, as shown in FIG. 8B, they are trapped in the active sites 240A. That is, migration of deposition species on the surface of the silicon nitride film 240 is suppressed. This decreases the rate of feeding deposition species to the sidewall S and bottom of the groove G, which results in small film thickness at the lower portion of the groove G.

On the contrary, when hydrogen (H$_2$) is introduced as one of the material gases, the active sites 240A are terminated.

Figure 9A:
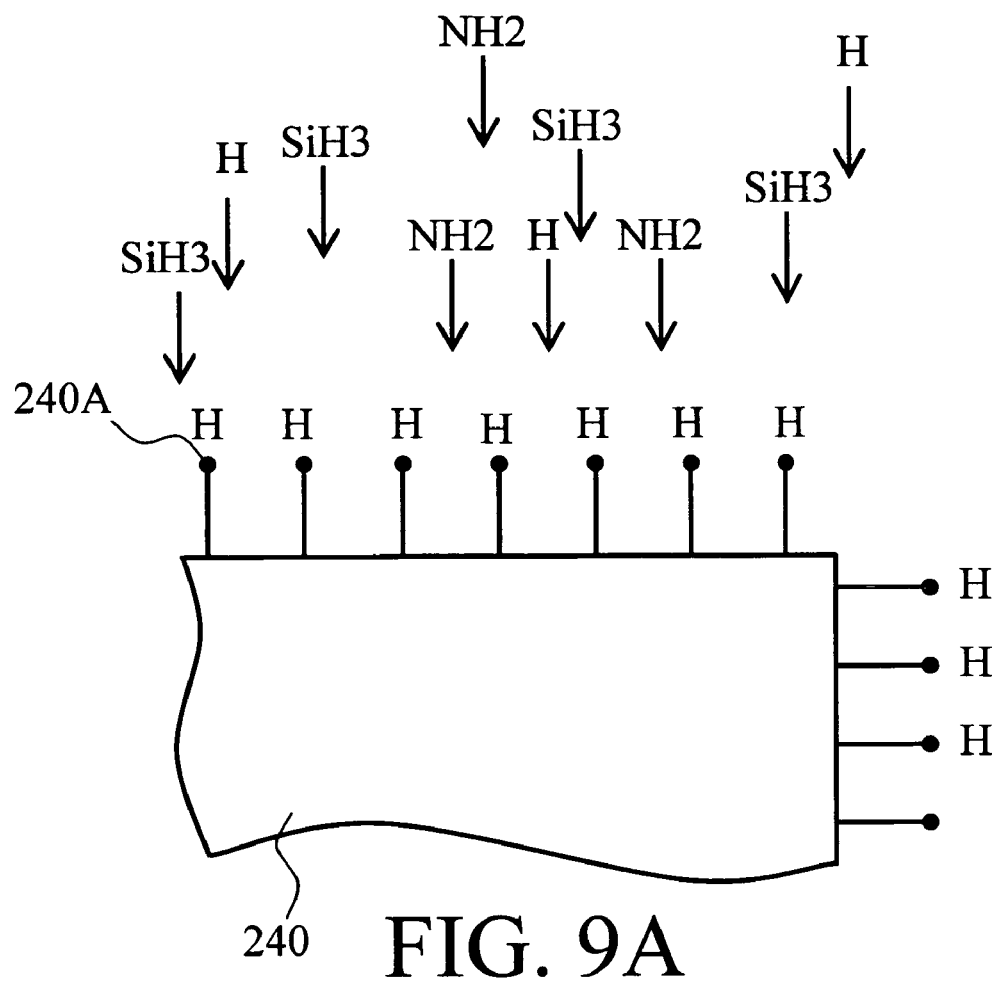
FIGS. 9A and 9B are conceptual diagrams showing a growing surface of silicon nitride film when hydrogen ($H_2$) is introduced.
Figure 9B:
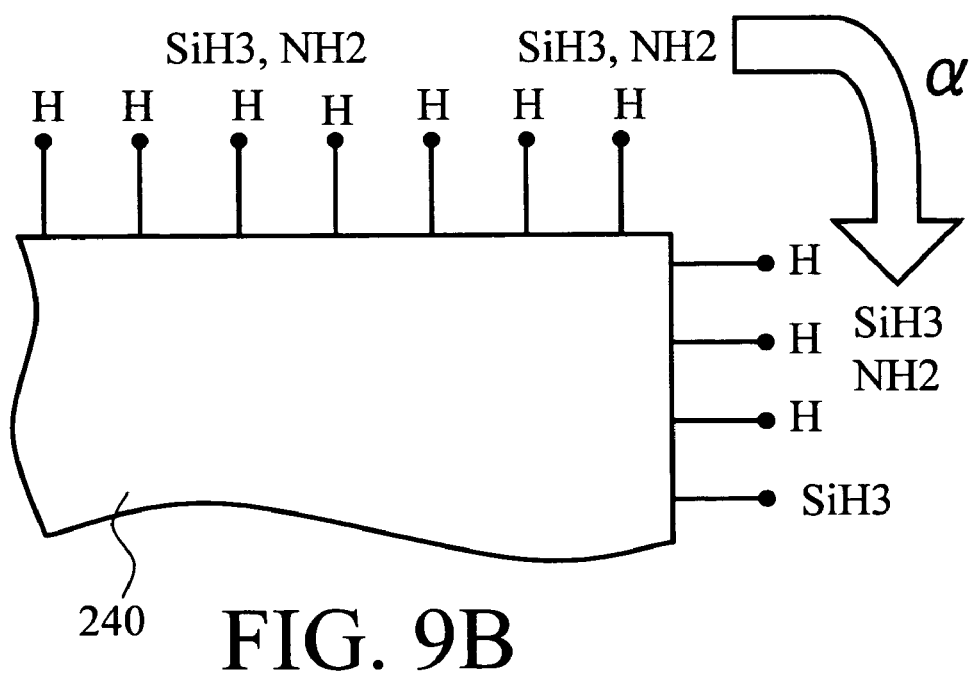

FIG. 9 is a conceptual diagram showing a growing surface of silicon nitride film when hydrogen (H$_2$) is introduced.

When hydrogen (H$_2$) is introduced as one of the material gases, it is decomposed into atomic hydrogen by catalyst 2. Then, the active sites 240A on the surface of the silicon nitride film 240 are terminated by these hydrogen atoms. In this way, deposition species such as SiH$_3$ and NH$_2$ falling on the growing surface having active sites 240A terminated by hydrogen can migrate across the growing surface to a long distance. That is, as indicated by an arrow a in FIG. 9B, the feed rate of deposition species toward the lower portion of the groove G increases. As a result, the step coverage can be improved.

In this respect, such an effect of hydrogen introduction can be similarly expected when silane (SiH$_4$) and ammonia are used for material gas. That is, when a silicon nitride film is formed by the catalytic CVD method using silane and ammonia, the step coverage can be improved by introducing hydrogen.

However, addition of hydrogen causes reduction of the number of active sites 240A on the surface of the thin film, as shown in FIG. 9. Consequently, adsorption of precursors such as nitriding species NH$_2$ is also suppressed, which results in a silicon nitride film with insufficient nitridation. That is, a silicon nitride film is formed that is silicon-rich and has a high refractive index. Silicon nitride film with silicon-rich film quality is undesirable for insulating film because it has low electric resistance and hence high leak current. In addition, the rate of etching by hydrofluoric acid also increases, which makes the film vulnerable.

When the amount of ammonia (NH$_3$) in terms of NH$_3$/SiH$_4$ flow rate ratio is increased to about seven in order to eliminate nitridation insufficiency to improve film quality, nitridation is promoted and hence the refractive index is improved. However, since SiH$_3$ is stabilized at the same time, the feed rate of deposition species toward the lower portion of the groove G is decreased, which deteriorates step coverage.

That is, when silane and ammonia are used for material gas, it is difficult to improve step coverage while maintaining the film quality at a high level.

In this respect, according to the invention, a high level of film quality can be obtained at the same time as improving step coverage by using gas containing silicon and nitrogen (first material gas) as one of the material gases.

Figure 10A:
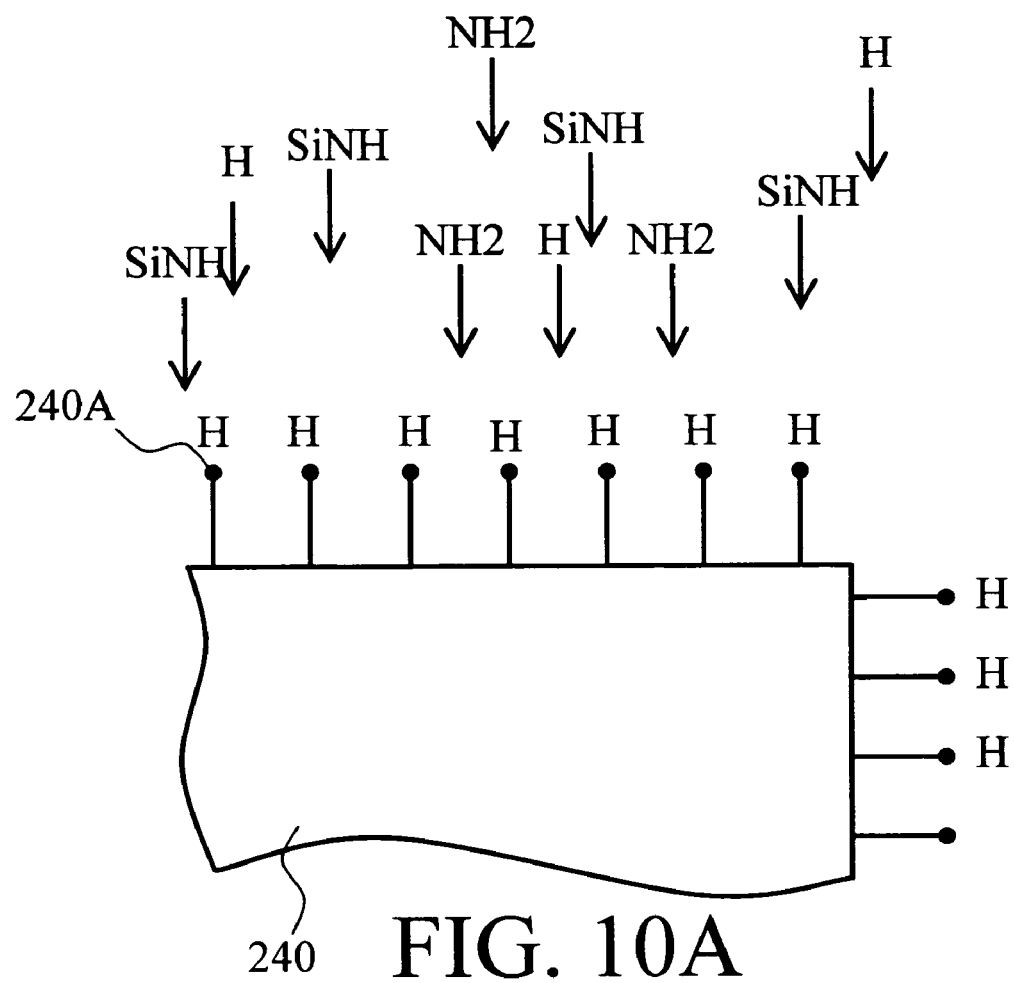
FIGS. 10A and 10B are conceptual diagrams showing a growing surface of silicon nitride film according to the invention.
Figure 10B:
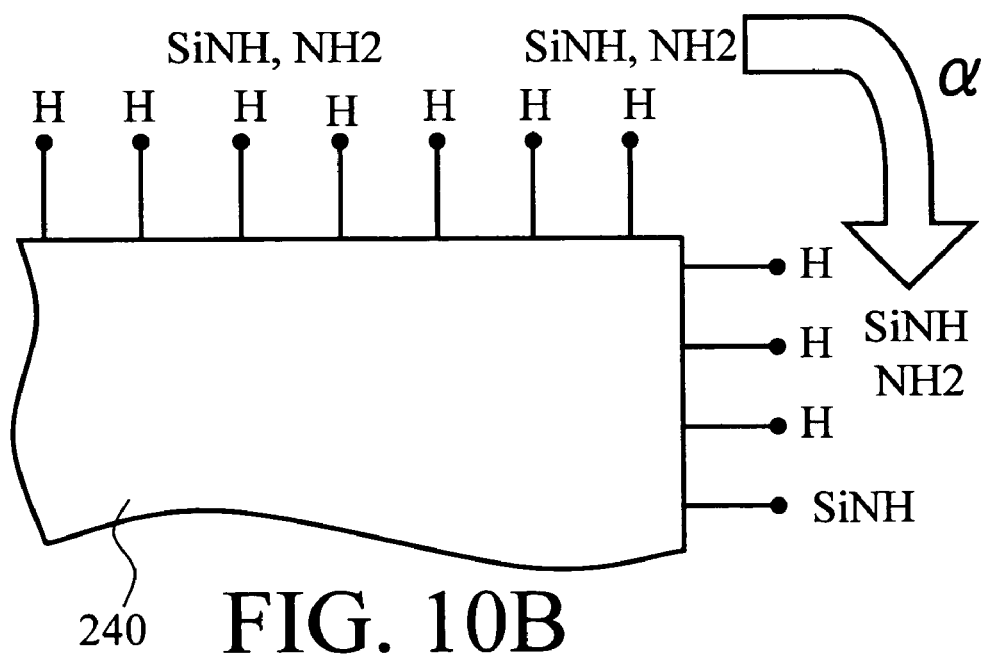

FIG. 10 is a conceptual diagram showing a growing surface of silicon nitride film according to the invention.

According to the invention, active sites 240A on the surface of silicon nitride film are terminated by introducing hydrogen, as shown in FIG. 10A, to form a condition where incoming deposition species are easy to migrate.

Furthermore, it is contemplated that gas containing silicon and nitrogen (first material gas) used as one of the material gases forms deposition species in which silicon and nitrogen are bonded. For example, when trisilylamine is used as one of the material gases, it is contemplated that catalyst 2 does not completely dissociate silicon and nitrogen, but forms deposition species in which silicon and nitrogen are bonded (such as Si—N and Si—N—H$_x$). Nitridation of silicon can thus be promoted to form a silicon nitride film of high quality with good balance of composition ratio between silicon and nitrogen by feeding deposition species in which silicon and nitrogen are bonded.

In addition, when gas containing silicon and nitrogen is decomposed by catalyst 2, the decomposed species thus formed are, for example, Si—N and Si—N—H$_x$. They are in a state where the composition ratio of silicon is greater than in stoichiometric silicon nitride (Si$_3$N$_4$), that is, in a "silicon-rich" state. In other words, in the formation method according to the invention, silicon-rich decomposed species such as Si—N fall and are adsorbed on the substrate.

On the other hand, introduction of hydrogen achieves an effect of "abstraction" of extra silicon. That is, the introduced hydrogen is excited and/or decomposed by catalyst 2 to produce hydrogen radicals and/or hydrogen atoms. These active hydrogen radicals and/or hydrogen atoms react with silicon-rich decomposed species such as Si—N adsorbed on the surface of the substrate to form silicon hydrides and desorb into the vapor phase. That is, an etching effect is obtained for silicon-rich decomposed species adsorbed on the surface of the substrate.

As a result, according to the invention, a state occurs in which adsorption of silicon-rich decomposed species competes with etching of these decomposed species by active hydrogen. The net deposition rate is determined by the difference between the adsorption and etching. Presumably, progress of deposition in a competing state of adsorption and etching of decomposed species thus shifts the balance of the growing system to a state near the rate-determining surface reaction, which improves coverage.

In addition to the termination effect by hydrogen at the growth front as described above with reference to FIGS. 8 to 10, a catalyst cleaning effect by hydrogen is also obtained.

More specifically, when silicon-containing gas and ammonia are fed to the vicinity of catalyst, the surface of the catalyst is covered with decomposed silicon, which prevents decomposition of ammonia. That is, a silicon-rich film tends to occur because silicon nitride film is formed in a condition where nitrogen is not sufficiently fed. In contrast, according to the invention, hydrogen is introduced to clean the silicon adsorbed on the surface of catalyst. A fresh surface of the catalyst is thus exposed, and hence decomposition of ammonia can be promoted. This results in a silicon nitride film with stoichiometric balance between silicon and nitrogen.

The formation condition and the obtained result for another specific example carried out by the inventor are summarized as follows:

| | |
|---|---|
| trisilylamine | 15 sccm |
| ammonia | 40 sccm |
| hydrogen | 40 sccm |
| pressure | 10 Pa |
| catalyst-substrate distance | 75 mm |
| catalyst temperature | 1800° C. |
| substrate temperature | 300° C. |
| film formation rate | 30 nm/min |
| refractive index | 1.98 |
| withstand voltage | 6 MV/cm |
| coverage | 80 percent |

Also in this specific example, the refractive index of the silicon nitride film was 1.98, and a stoichiometric silicon nitride film was obtained. The obtained film formation rate was 30 nanometers per minute, which is a more practical rate. Furthermore, it can be confirmed that the withstand voltage (6 MV/cm) is at an extremely good level, which is comparable to the withstand voltage of silicon nitride film formed by the high-temperature CVD method using dichlorosilane and ammonia at 760° C. and 27 pascals. The obtained coverage was 80 percent, which is also a good result. It should be noted that the coverage was evaluated on the basis of the definition described above with reference to FIG. 6.

On the other hand, the inventor formed another silicon nitride film in a similar condition using silane ($SiH_4$) instead of trisilylamine. As a result, the refractive index was as high as 2.2, and the withstand voltage was as low as 3 MV/cm. This is presumably because a silicon-rich silicon nitride film was formed.

Further results of experiments carried out by the inventor are summarized as follows:

| gas (flow rate) | coverage | withstand voltage | refractive index |
|---|---|---|---|
| $SiH_4$ (12 sccm)/$NH_3$ (200 sccm) | 30% | $\geq$6 MV/cm | 1.95 |
| $SiH_4$ (12 sccm)/$NH_3$ (30 sccm) | 60% | $\leq$4 MV/cm | 2.4 |
| $SiH_4$ (12 sccm)/$NH_3$ (12 sccm)/ $H_2$ (100 sccm) | 60% | $\leq$4 MV/cm | 2.2 |
| TSA (12 sccm)/$NH_3$ (30 sccm) | 60% | 4-6 MV/cm | 2.1 |
| TSA (12 sccm)/$NH_3$ (12 sccm)/ $H_2$ (100 sccm) | 80% | $\geq$6 MV/cm | 2.0 |

It can be confirmed from these results that by using gas containing silicon and nitrogen and further adding hydrogen thereto, a silicon nitride film with good coverage, withstand voltage and refractive index is obtained.

As described above, according to the invention, the step coverage can be significantly improved by adding hydrogen while maintaining the composition ratio of silicon and nitrogen within a good range. As a result, various effects are achieved by applying the invention to, for example, manufacturing of semiconductor integrated circuit devices.

Figure 11:
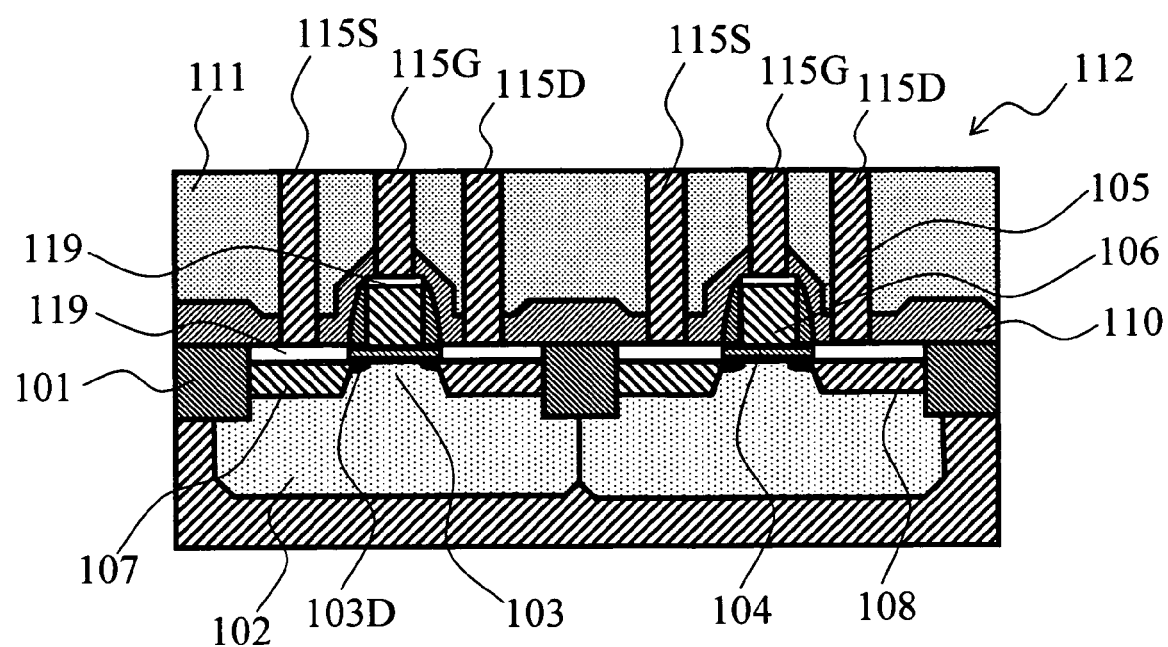
FIG. 11 is a schematic view illustrating a cross-sectional structure of MOSFETs.

FIG. 11 is a schematic view illustrating a cross-sectional structure of MOSFETs.

More specifically, the surface portion of a silicon substrate is isolated and separated by component separation regions 101, and a MOSFET is formed in each of the separated wells 102. Each MOSFET comprises a source region 107, a drain region 108, and a channel 103 provided between them. A gate electrode 106 is provided on the channel 103 via a gate isolation film 104. LDD (lightly doped drain) regions 103D are provided between the source/drain region 107, 108 and the channel 103 for the purpose of preventing the so-called "short channel effect". A gate sidewall 105 is provided adjacent to the gate electrode 106 on the LDD region 103D. The gate sidewall 105 is provided in order to form the LDD region 103D in a self-aligned manner.

Silicide layers 119 are provided on the source/drain region 107, 108 and the gate electrode 106 for improving contact with the electrodes. The upper side of this structure is covered with a silicon nitride film 110 and an interlayer isolation film 111, through which contact holes penetrate. Source wiring 115S, gate wiring 115G, and drain wiring 115D are formed through the contact holes.

When a transistor of such a semiconductor integrated circuit is manufactured, the gate sidewall 105 is formed from silicon nitride film. However, if the silicon nitride film has poor step coverage, the thickness of silicon nitride film grown as the gate sidewall 105 varies depending on the distance to adjacent patterns, which causes variation of the transistor threshold.

FIG. 12 is a process cross-sectional view illustrating a method of manufacturing a gate sidewall 105.

Figure 12A:
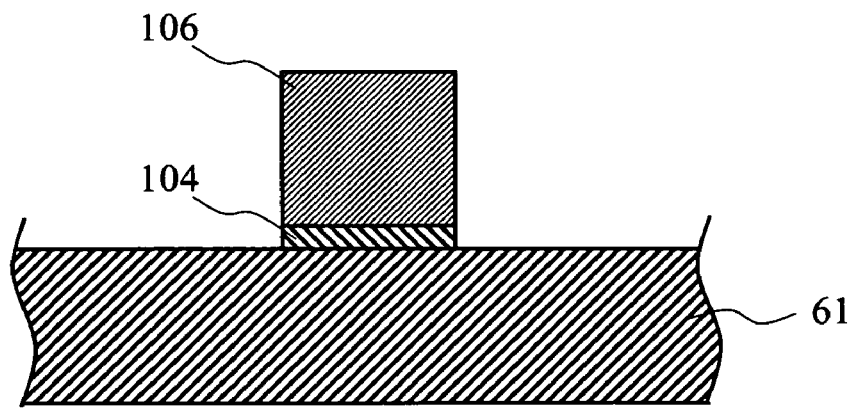
FIGS. 12A through 12C are process cross-sectional views illustrating a method of manufacturing a gate sidewall 105.

First, as shown in FIG. 12A, a gate electrode 106 is formed via a gate isolation film 104 on a substrate 61.

Figure 12B:
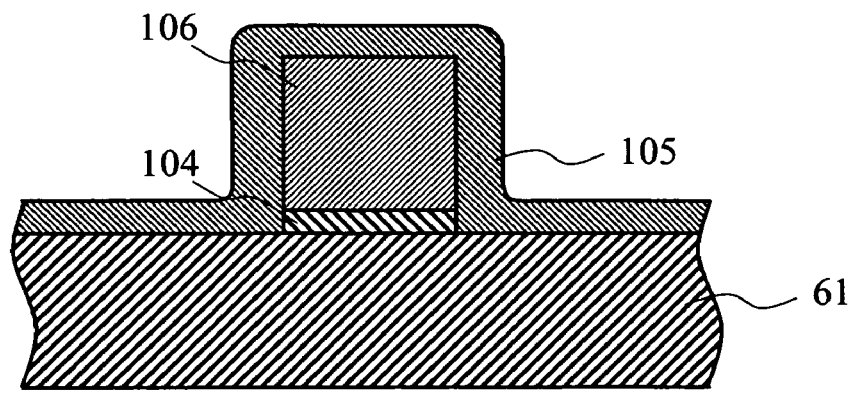

Next, as shown in FIG. 12B, a silicon nitride film 105 is formed thereon. At this time, it can be formed by the method according to the invention as described above with reference to FIGS. 1 to 9.

Figure 12C:
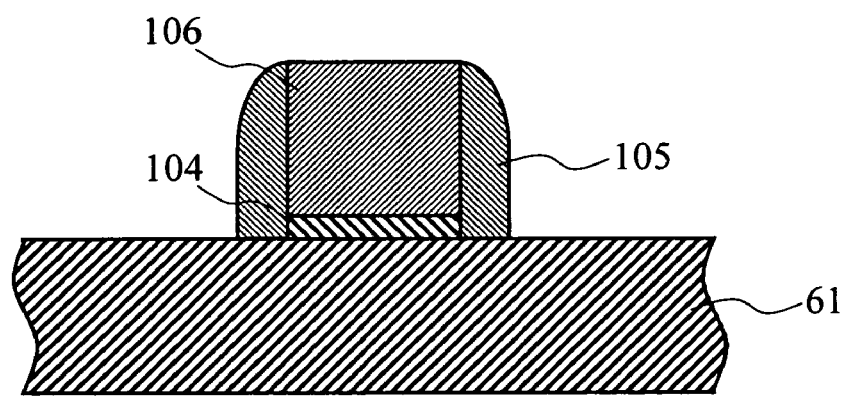

Next, as shown in FIG. 12C, the silicon nitride film 105 is processed by dry etching to form a sidewall 105. More specifically, as a result of etching in a direction generally normal to the principal surface of the substrate 61 by a highly anisotropic etching method such as RIE (reactive ion etching), silicon nitride film is left only on the side surface of the gate isolation film 104 and gate electrode 106 to be formed as sidewall 105.

Since this sidewall 105 is formed by the method according to the embodiment of the invention, it has good coverage. In other words, when the degree of integration of such a semiconductor integrated circuit increases, the spacing between adjacent gates decreases. As a result, if a conventional deposition method is used, the coverage of silicon nitride film for forming the gate sidewall 105 decreases.

In this respect, according to the invention, as described above with reference to FIGS. 1 to 10, a silicon nitride film 105 with high step coverage can be formed while maintaining the balance of composition ratio between silicon and nitrogen. As a result, a scaled and highly-integrated semiconductor device can be manufactured without variation of the transistor threshold.

On the other hand, for the interlayer isolation film 111, silicon oxide film is commonly used. It is required that contact holes be formed in this silicon oxide film as shown, and that source wiring 115S, gate wiring 115G, and drain wiring 115D be formed. However, as seen from FIG. 11, the depth of the contact hole above the gate electrode 106 is different from that above the source/drain region 107, 108. Consequently, if etching for making contact holes is carried out in the same condition, the amount of overetching differs, which may cause problems such as faulty connection of contacts. For this reason, a silicon nitride film 110 is provided as an underlay for the silicon oxide film 111. More specifically, since the silicon nitride film 110 has sufficiently high etching selection ratio relative to the silicon oxide film 111, the silicon nitride film 110 serves as an etching stopper in etching the silicon oxide film 111. As a result, contact holes with different depths can be simultaneously etched. Formation of contact holes is completed by etching the silicon nitride film 110 subsequent to etching the silicon oxide film 111.

However, if the silicon nitride film 110 has poor step coverage, the thickness of silicon nitride film 110 varies depending on the distance to adjacent patterns as described above, which causes variation of the amount of overetching for the silicon nitride film 110 and leads to a problem of faulty connection.

Also in this respect, according to the invention, as described above with reference to FIGS. 1 to 10, a silicon nitride film with high step coverage can be formed while maintaining the balance of composition ratio between silicon and nitrogen. This can prevent variation of the amount of overetching for the silicon nitride film 110 and eliminate problems such as faulty connection.

These points will be described in further detail with reference to the process of manufacturing a semiconductor device.

Figure 13:
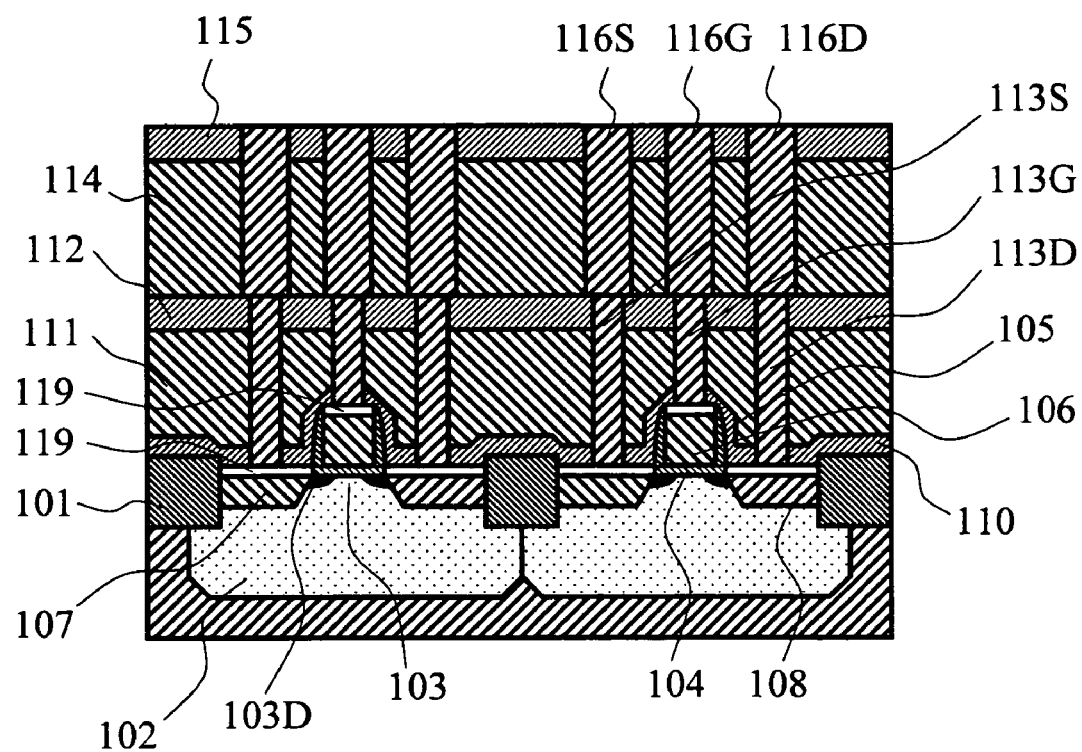
FIG. 13 is a schematic view illustrating the cross-sectional structure of a relevant part of another semiconductor device manufactured according to the invention.

FIG. 13 is a schematic view illustrating the cross-sectional structure of a relevant part of another semiconductor device manufactured according to the invention. More specifically, this figure also shows a relevant part of MOSFET (Metal Oxide Semiconductor Field Effect Transistor) that constitutes a semiconductor integrated circuit. In FIG. 13, elements similar to those described with reference to FIG. 11 are marked with the same numerals and are not described in detail.

In this specific example, the transistor is covered with a first interlayer isolation film 110, a second interlayer isolation film 111 and a third interlayer isolation film 112, through which contact holes penetrate. Source contact 113S, gate contact 113G, and drain contact 113D are formed through the contact holes. Here, the first interlayer isolation film 110 and the third interlayer isolation film 112 can be formed, for example, from silicon nitride. The second interlayer isolation film 111 can be formed, for example, from silicon oxide.

Further thereon, a fourth interlayer isolation film 114 and a fifth interlayer isolation film 115 are formed. In trenches penetrating through them, source wiring 116S, gate wiring 116G, and drain wiring 116D are each embedded. Here, the fourth interlayer isolation film 114 can be formed from silicon oxide. The fifth interlayer isolation film 115 can be formed from silicon nitride.

In manufacturing a semiconductor device as described above, according to the invention, not only the gate sidewall 105, but also the silicon nitride film constituting the gate insulation film 104, the first interlayer isolation film 110, the third interlayer isolation film 112, and the fifth interlayer isolation film 115 can be formed by the method described above with reference to FIGS. 1 to 10.

FIGS. 14 to 18 are a process cross-sectional view showing a method of manufacturing a semiconductor device of this specific example.

Figure 14A:
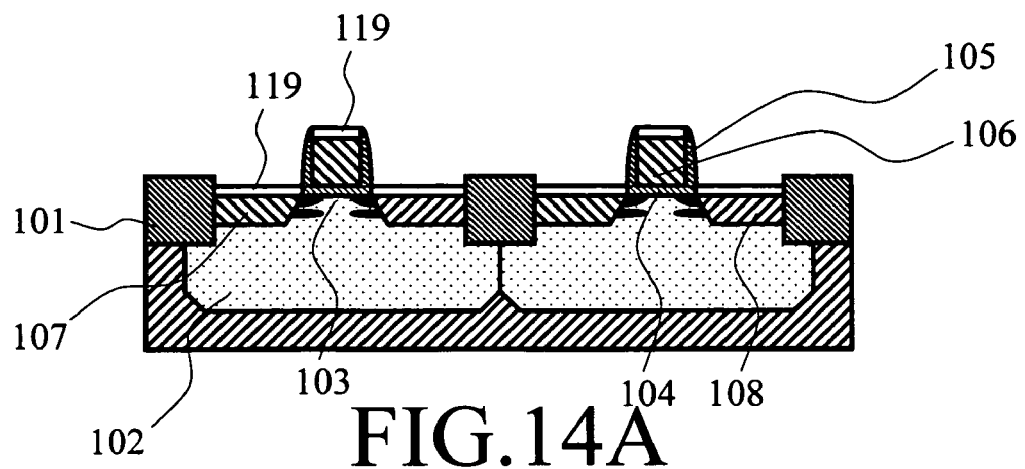
FIGS. 14A to 18B are process cross-sectional views showing a method of manufacturing a semiconductor device of a specific example of the invention.

First, as shown in FIG. 14A, the relevant part of MOS transistor is formed. More specifically, on a Si substrate, a component separation region 101, well 102, channel 103, gate isolation film 104, gate electrode 106, and LDD injection sidewall (gate sidewall) 105 are sequentially formed, and a source region 107 and a drain region 108 are formed. Furthermore, nickel (Ni) sputtering and RTP (rapid thermal processing) are sequentially performed to form a silicide layer 119 made of nickel silicide.

Here, in the step of forming the gate isolation film 104, the silicon nitride film can be formed by the method described above with reference to FIGS. 1 to 10. In this respect, the gate isolation film 104 is not limited to a single silicon nitride film. Rather, it can have a stacked structure of a film made of silicon oxide or high-k (high dielectric constant) material and a silicon nitride film. In this case, the method described above with reference to FIGS. 1 to 10 can be carried out with respect to the silicon nitride film.

In addition, also in the step of forming the gate sidewall 105, as described above with reference to FIG. 12, the silicon nitride film can be deposited by the method of the invention.

Figure 14B:
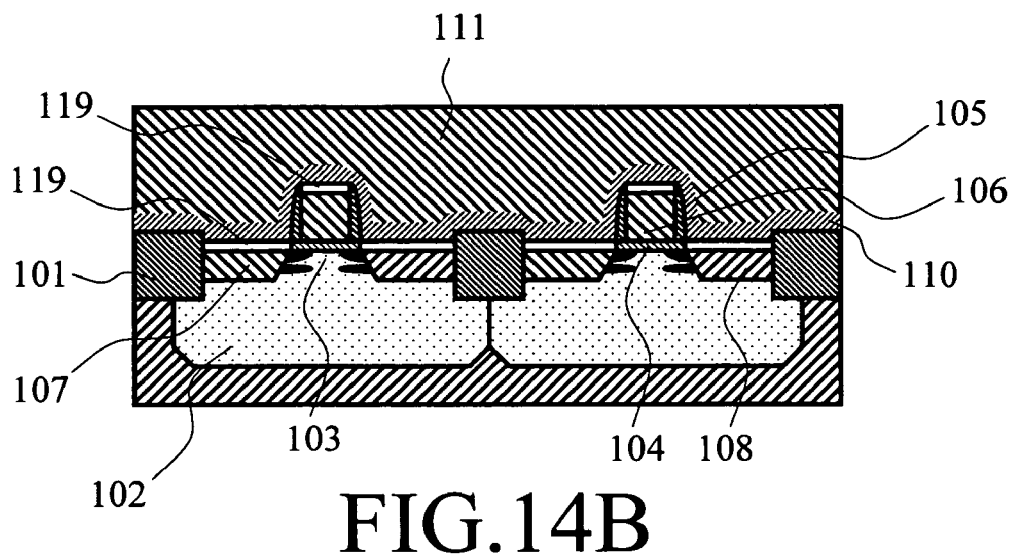

Next, as shown in FIG. 14B, a first interlayer isolation film 110 and a second interlayer isolation film 111 are formed. Here, for the first interlayer isolation film 110, a silicon nitride film with a thickness of about 50 nm is formed by the method described above with reference to FIGS. 1 to 10. At this time, it is desirable that the temperature during forming the silicon nitride film is kept down at 500° C. or less in order to prevent increase of contact resistance of the underlying silicide layer 119 made of nickel silicide. In this respect, according to the invention, a silicon nitride film with good film quality and good coverage can be formed even at a lower temperature of about 450° C., for example.

After the silicon nitride film is thus formed as the first interlayer isolation film 110, a silicon oxide film with a thickness of 600 nm is formed as the second interlayer isolation film 111 by plasma CVD using TEOS (tetraethoxysilane) gas at 600° C.

Alternatively, the second interlayer isolation film 111 may be made of material with lower dielectric constant. Such material may include silicon oxides having methyl group(s), silicon oxides having hydrogen group(s), and organic polymers. More specifically, the material may include, for example, various silsesquioxane compounds such as porous methyl silsesquioxane (MSQ), polyimide, fluorocarbon, parylene, and benzocyclobutene. The method of forming such materials may include the spin on glass (SOG) method in which a thin film is formed by spin coating and heat treating the solution.

Figure 14C:
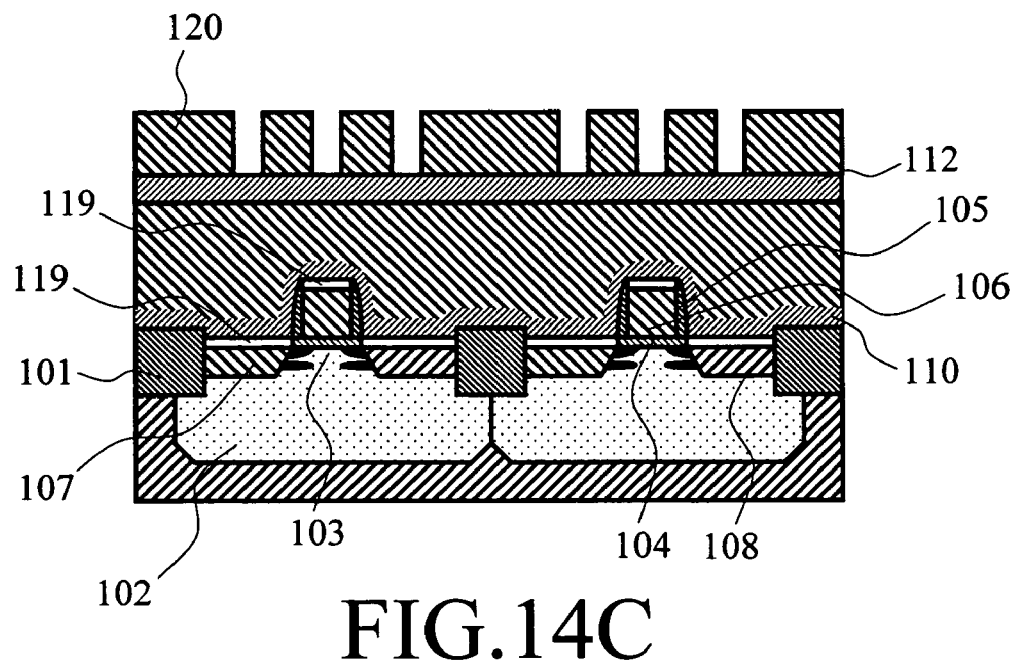

After the second interlayer isolation film 111 is thus formed, as described in FIG. 14C, a silicon nitride film is formed thereon as the third interlayer isolation film 112. Also at this time, according to the method of the invention, a silicon nitride film with a thickness of about 120 nm can be formed at a film formation temperature of about 450° C., for example. By keeping down the film formation temperature, deterioration of nickel silicide constituting the silicide layer 119 can be prevented.

Subsequently, resist is applied and patterned to form a resist pattern 120. The resist pattern 120 is formed, for example, by exposure at 120 nm diameter using an ArF exposure apparatus.

Figure 15A:
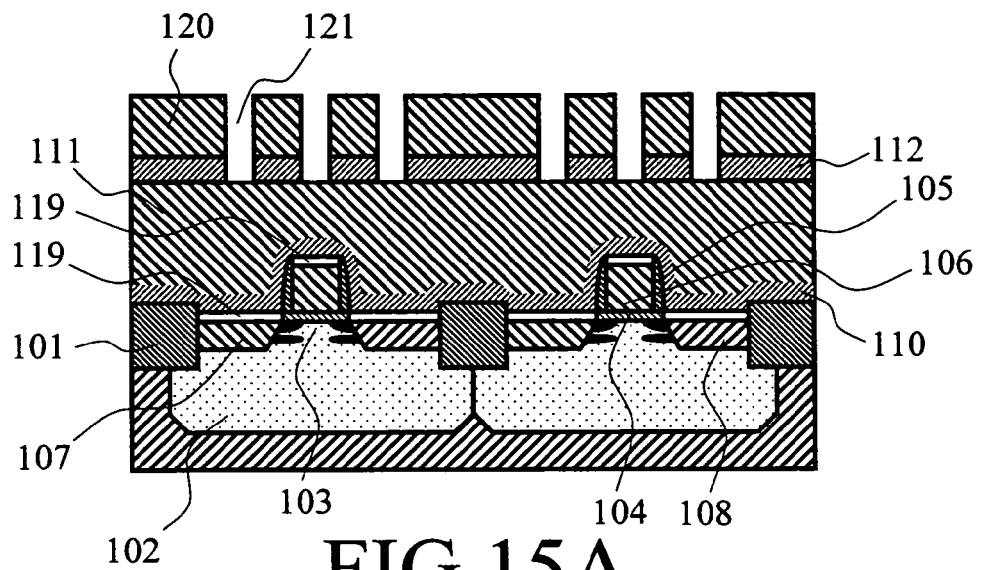

Next, as shown in FIG. 15A, the third interlayer isolation film 112 is etched using the resist pattern 120 as a mask. The etching method may include, for example, a method using ICP (induction coupled plasma) reactive ion etching apparatus. In etching the third interlayer isolation film 112, openings 121 may be formed in the interlayer isolation film 112, for example, by etching it using mixture gas of $CH_2F_2$ (50 sccm) and $O_2$ (50 sccm) at 6.7 pascals (Pa).

Figure 15B:
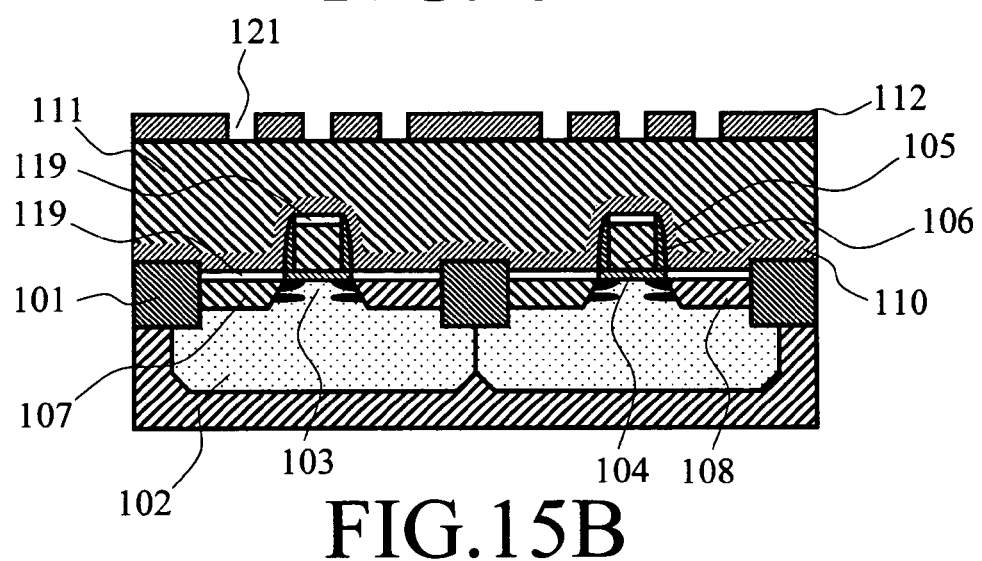

Next, as shown in FIG. 15B, the resist mask 120 is removed by ashing with oxygen plasma.

Figure 15C:
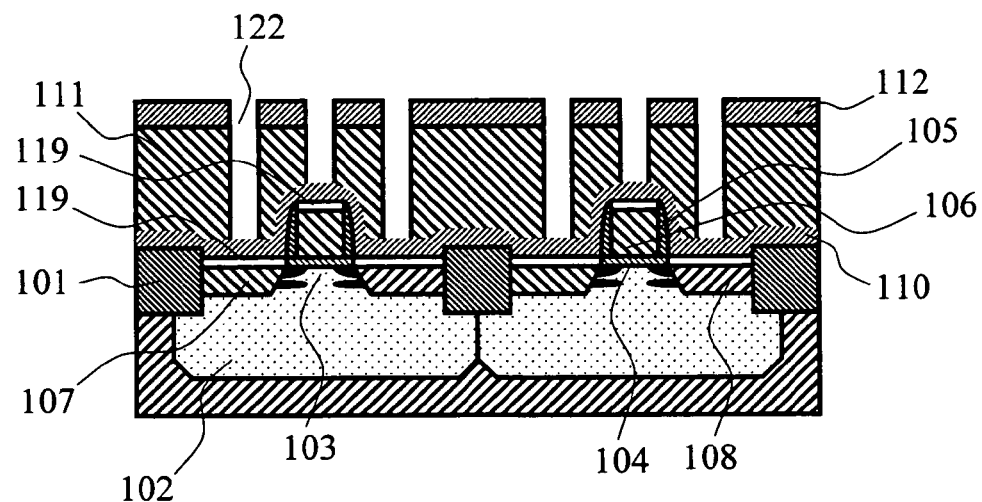

Subsequently, as shown in FIG. 15C, contact holes are formed in the second interlayer isolation film 111. In forming contact holes in the second interlayer isolation film 111, reactive ion etching is carried out using mixture gas of $C_4F_6$ (50 sccm), CO (50 sccm), $O_2$ (50 sccm), and Ar (200 sccm) at 6.7 pascals. In this manner, the contact holes 122 in the second interlayer isolation film 111 are formed.

At this time, etching can be stably carried out by using the third interlayer isolation film 112 made of silicon nitride film as an etching mask. More specifically, a large etching selection ratio can be easily obtained by causing etching rates to differ between the silicon oxide film constituting the second interlayer isolation film 111 and the silicon nitride film constituting the third interlayer isolation film 112. Consequently, the second interlayer isolation film 111 can be etched in a condition where it is firmly masked by the third interlayer isolation film 112. That is, a desired opening can be stably formed by eliminating problems such as variation of etching opening size due to mask degradation.

On the other hand, since the first interlayer isolation film 110 is formed from the same silicon nitride film as that of the third interlayer isolation film 112, the first interlayer isolation film 110 functions reliably as an etching stopper. That is, problems due to overetching and underetching can also be eliminated.

Figure 16A:
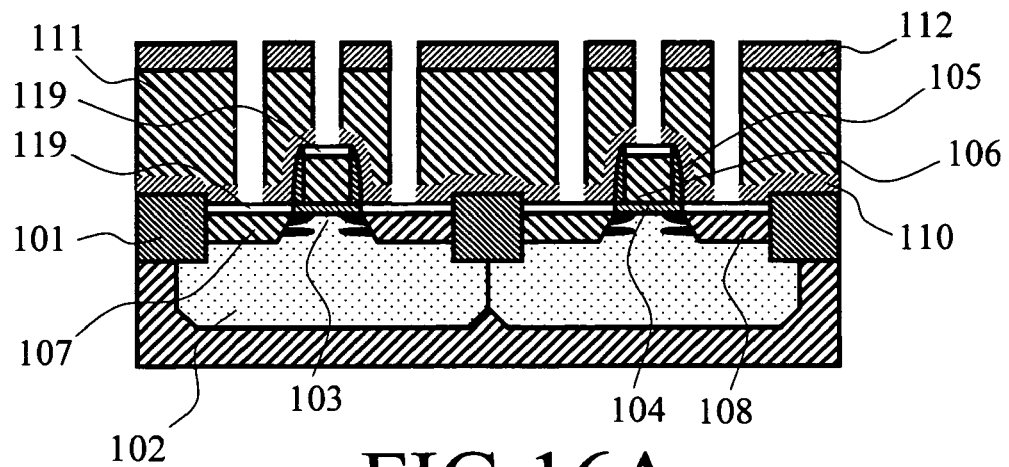

Next, as shown in FIG. 16A, contact holes are formed in the first interlayer isolation film 110. When the first interlayer isolation film 110 is formed from the same kind of materials as that of the third interlayer isolation film 112, the third interlayer isolation film 112 is also etched in this etching step. Consequently, the third interlayer isolation film 112 must be formed with greater thickness than the first interlayer isolation film 110. In terms of the etching condition, etching can be carried out by the reactive ion etching method using mixture gas of $CH_2F_2$ (50 sccm), $O_2$ (50 sccm), and Ar (200 sccm) at 6.7 pascals.

Figure 16B:
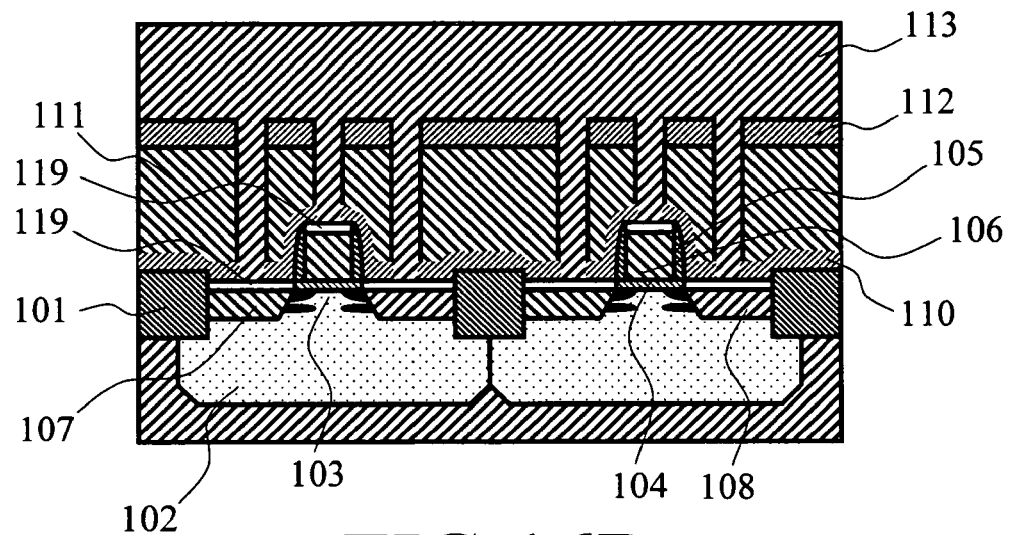

Next, as shown in FIG. 16B, contact metal 113 is deposited.

Figure 16C:
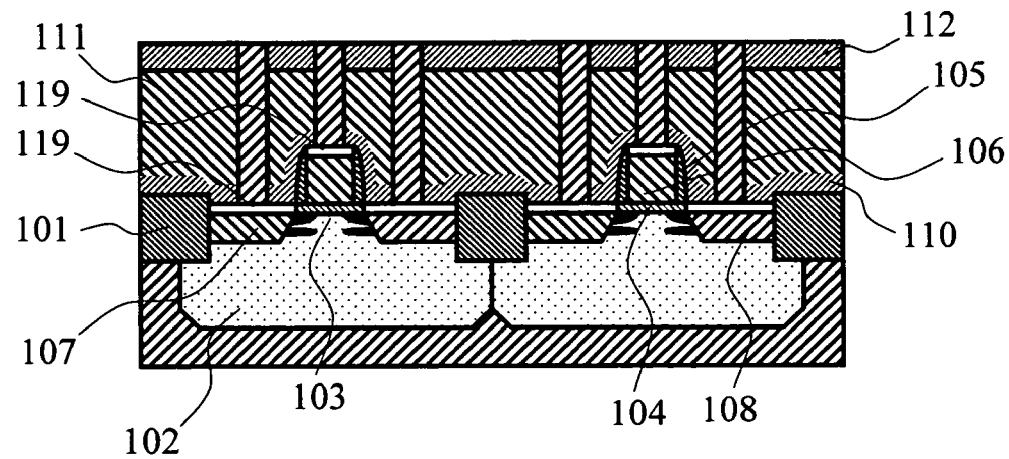

The surface is then polished by chemical mechanical polishing (CMP) for planarization. In this way, a structure in which contact metal is embedded as shown in FIG. 16C can be formed. It should be noted that also at this time, the third interlayer isolation film 112 enables the second interlayer isolation film 111 to be protected against polishing by CMP. More specifically, the second interlayer isolation film 111 can be prevented from being polished and thinned in its film thickness at the time of CMP polishing by providing the third interlayer isolation film 112 made of relatively hard material such as silicon nitride on top of the second interlayer isolation film 111 formed from relatively soft material such as porous silicon oxide. As a result, problems such as increase of interwiring capacitance and current leak can be suppressed.

Figure 17A:
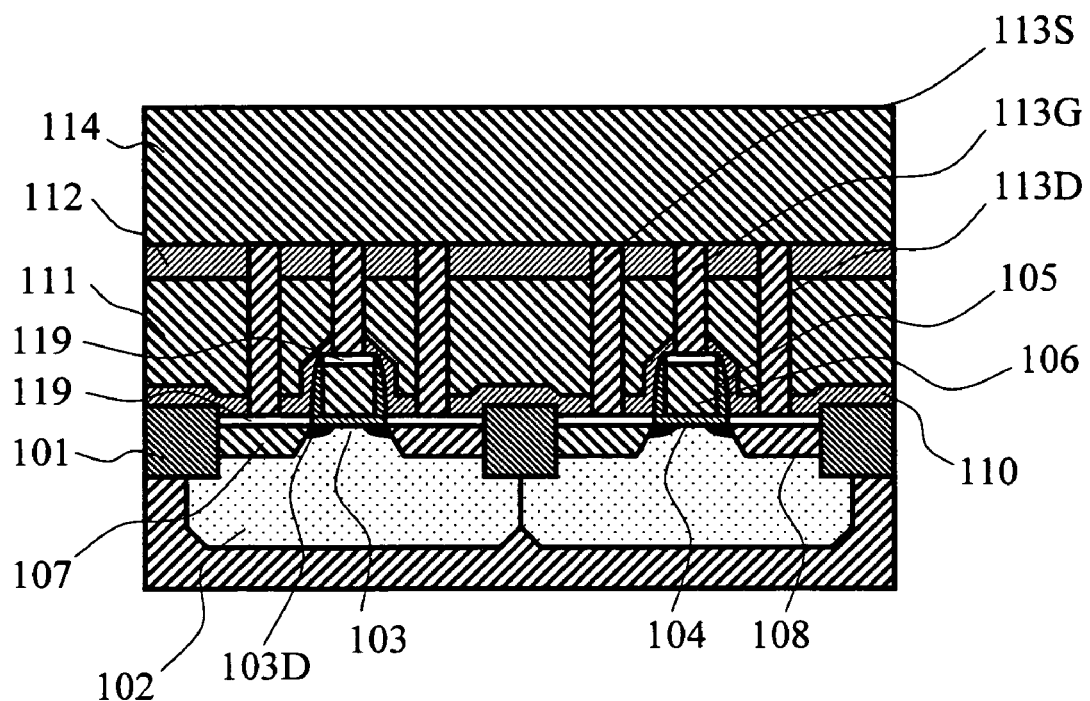
Figure 17B:
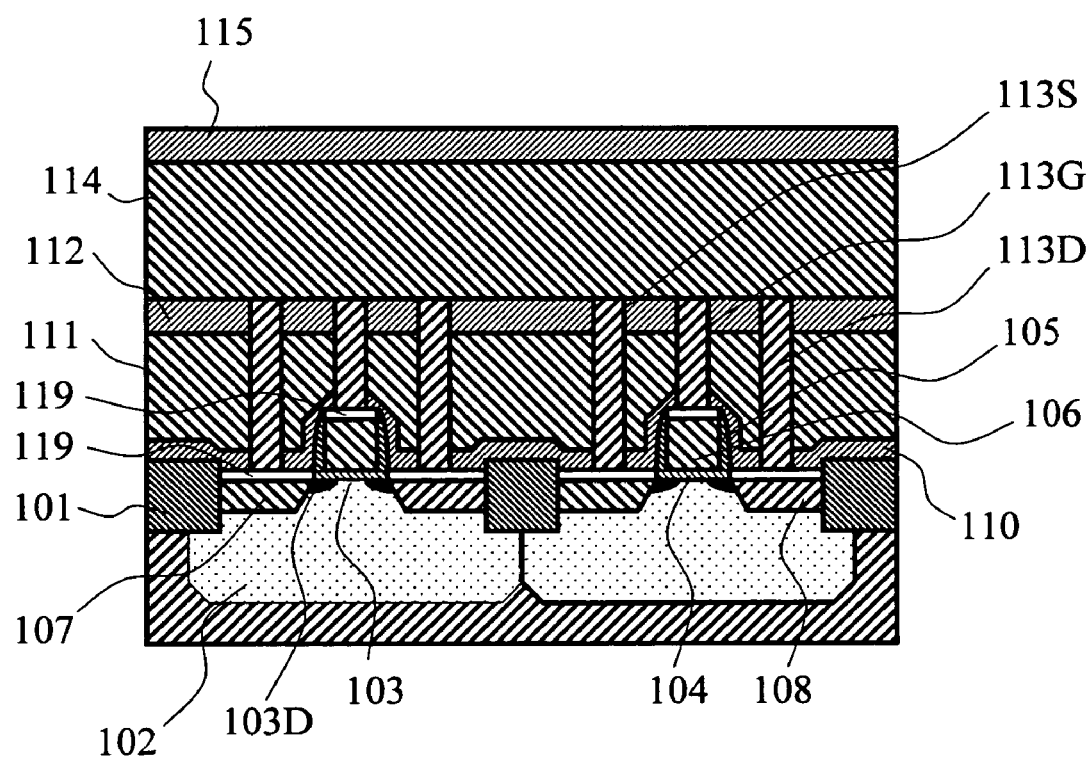

Next, as shown in FIG. 17A, porous silicon oxide is deposited as the fourth interlayer insulation film 114 using raw material such as MSQ. Then, as shown in FIG. 17B, silicon nitride film, for example, is deposited as the fifth interlayer insulation film 115. Also at this time, the method as described above with reference to FIGS. 1 to 10 can be used.

Figure 18A:
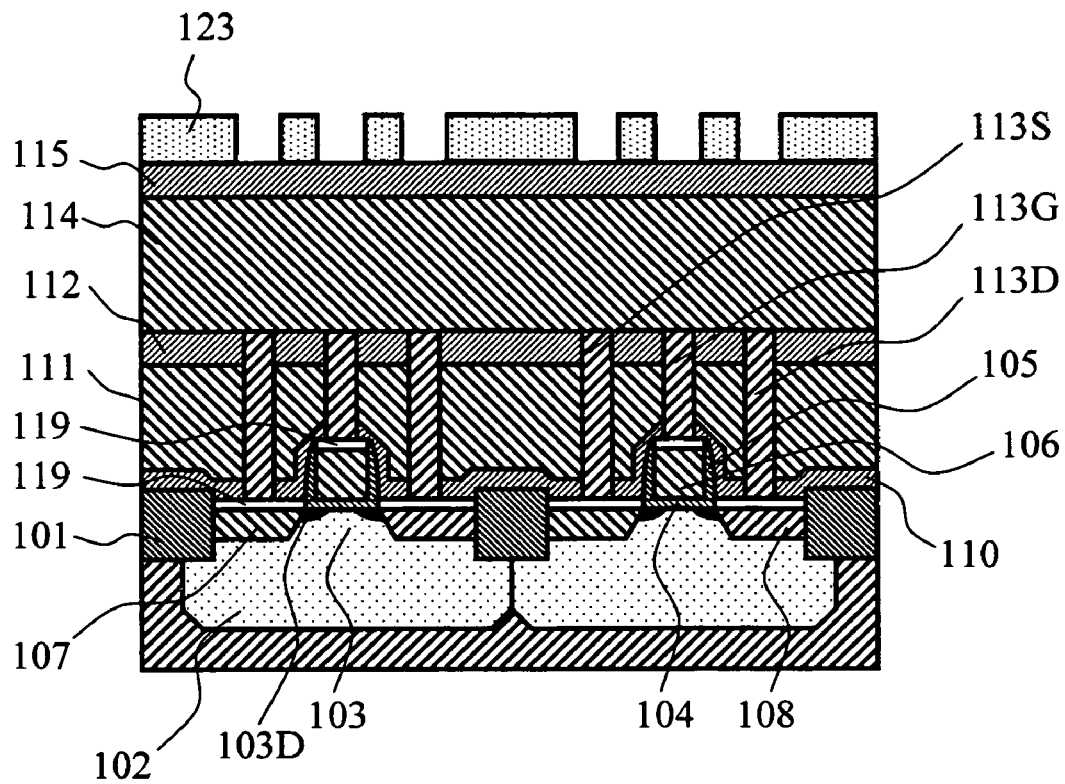

Next, as shown in FIG. 18A, a resist pattern 123 is formed.

Figure 18B:
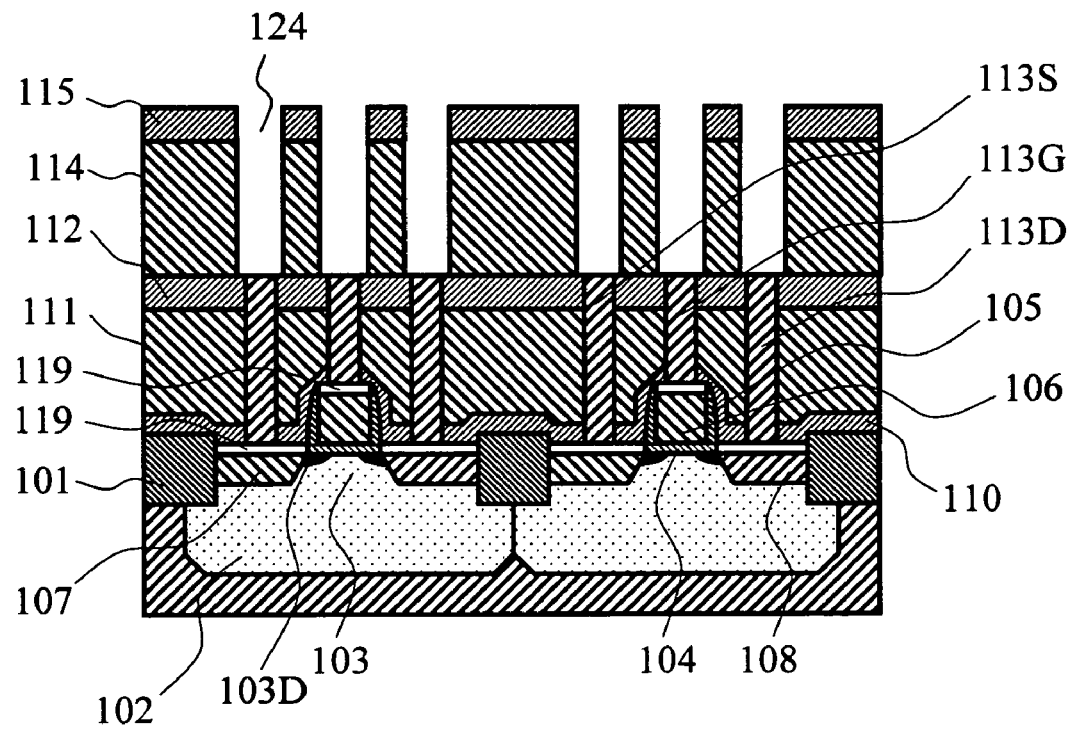

Then, as shown in FIG. 18B, trenches 124 are formed by etching the fifth interlayer insulation film 115 and the fourth interlayer insulation film 114, respectively. In etching the fifth interlayer insulation film 115, openings may be formed in the interlayer isolation film 115, for example, by etching it using mixture gas of $CH_2F_2$ (50 sccm) and $O_2$ (50 sccm) at 6.7 pascals (Pa). In forming trenches in the fourth interlayer insulation film 114, reactive ion etching may be carried out using mixture gas of $C_4F_6$ (50 sccm), CO (50 sccm), $O_2$ (50 scCm), and Ar (200 sccm) at 6.7 pascals. At this time, the fifth interlayer isolation film 115 can be used as a hard mask, and at the same time, the third interlayer isolation film 112 can be used as an etching stopper. More specifically, in etching the fourth interlayer isolation film 114 formed from silicon oxide, the fifth interlayer isolation film 115 formed from silicon nitride can be used as a hard mask, and the third interlayer isolation film 112 also formed from silicon nitride can be used as an etching stopper, to suppress overetching and form the trench with precision.

Subsequently, metal for wiring is deposited, and then smoothing is carried out by CMP polishing. In this way, as shown in FIG. 18, an interlayer wiring structure can be formed in which source wiring 116S, gate wiring 116G, and drain wiring 116D are embedded in the trenches, respectively.

As described above, according to the present embodiment, the silicon nitride film constituting insulation films 105, 110, 112, and 115 acting as a gate sidewall, etching stopper, and hard mask can be formed with good coverage. Consequently, these insulation films can be deposited with good coverage even when the degree of integration of the semiconductor integrated circuit is increased and gate electrodes 106 are closely packed. In addition, the method of forming a silicon nitride film according to the present embodiment can form insulation film at low temperatures, thereby preventing deterioration of the silicide layer 119.

The embodiments of the invention have been described with reference to specific examples. However, the invention is not limited to these specific examples.

For example, any variations of the specific structure, material of the catalyst, shape, and size of the apparatus used in carrying out the catalytic CVD method, appropriately designed by those skilled in the art, as well as those illustrated in FIG. 3, are also encompassed within the scope of the invention. Various conditions such as the kind of material gas, the thickness of the formed silicon nitride film, the kind, size, and temperature of the substrate, and the pressure, appropriately selected by those skilled in the art, are encompassed within the scope of the invention.

Furthermore, any other methods of manufacturing a silicon nitride film that comprise the elements of the invention and that may be appropriately modified by those skilled in the art are encompassed within the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method of forming a silicon nitride film comprising:
   forming a silicon nitride film by applying a first gas, a second gas, and hydrogen ($H_2$) gas to a catalyst heated in a reduced pressure atmosphere, wherein
   the first gas contains silicon and nitrogen, and
   the second gas contains nitrogen and hydrogen.

2. The method of forming a silicon nitride film as claimed in claim 1, wherein the first gas is decomposed by being applied to the catalyst to form deposition species in which silicon and nitrogen are bonded.

3. The method of forming a silicon nitride film as claimed in claim 1, wherein the first gas is any one selected from the group consisting of trisilylamine, disilylamine, and $(C_xH_y)_z$SiX, where X is an amino group.

4. The method of forming a silicon nitride film as claimed in claim 1, wherein the second gas is at least one of ammonia and methylamine.

5. The method of forming a silicon nitride film as claimed in claim 1, wherein hydrogen is introduced into the reduced pressure atmosphere with the first gas and the second gas.

6. The method of forming a silicon nitride film as claimed in claim 1, wherein the silicon nitride film is formed on a substrate having a surface on which a step or a groove is formed.

7. The method of forming a silicon nitride film as claimed in claim 1, wherein the catalyst is an electrically heated metal body.

8. The method of forming a silicon nitride film as claimed in claim 1, wherein the catalyst comprises at least one selected from the group consisting of tungsten (W), platinum (Pt), palladium (Pd), molybdenum (Mo), tantalum (Ta), titanium (Ti), vanadium (V), rhenium (Re), iridium (Ir), silicon (Si), and alumina ($AlO_x$).

* * * * *